United States Patent
Darwish et al.

(10) Patent No.: US 11,059,128 B2
(45) Date of Patent: Jul. 13, 2021

(54) MULTIPLE BEAM PULSED LASER DEPOSITION OF COMPOSITE FILMS

(71) Applicant: Dillard University, New Orleans, LA (US)

(72) Inventors: Abdalla Darwish, Kenner, LA (US); Sergey Sarkisov, Huntsville, AL (US)

(73) Assignee: Dillard University, New Orleans, LA (US)

( * ) Notice: Subject to any disclaimer, the term of this patent is extended or adjusted under 35 U.S.C. 154(b) by 0 days.

(21) Appl. No.: 16/601,536

(22) Filed: Oct. 14, 2019

(65) Prior Publication Data

US 2020/0055140 A1    Feb. 20, 2020

Related U.S. Application Data

(63) Continuation-in-part of application No. 14/506,685, filed on Oct. 5, 2014, now abandoned, which is a
(Continued)

(51) Int. Cl.
*B23K 26/03* (2006.01)
*B23K 26/00* (2014.01)
(Continued)

(52) U.S. Cl.
CPC ........ *B23K 26/0006* (2013.01); *B23K 26/032* (2013.01); *B23K 26/0643* (2013.01);
(Continued)

(58) Field of Classification Search
CPC ............. B23K 26/0006; B23K 26/032; B23K 26/0643; B23K 26/0652; H01S 3/094076;
(Continued)

(56) References Cited

U.S. PATENT DOCUMENTS

| 5,760,366 A * | 6/1998 | Haruta ................... C23C 14/22 219/121.68 |
| 2002/0081397 A1 * | 6/2002 | McGill ................... C23C 14/28 427/596 |

(Continued)

FOREIGN PATENT DOCUMENTS

KR    100745619 B1 *    8/2007

OTHER PUBLICATIONS

KR-100745619-B1, machine translation, originally published 2007, p. 1-7 (Year: 2007).*

(Continued)

*Primary Examiner* — Gordon Baldwin
*Assistant Examiner* — Christina D McClure
(74) *Attorney, Agent, or Firm* — James Richards

(57) ABSTRACT

The present disclosure generally relates to a system and method for multiple beam laser deposition of thin films wherein separate laser beams are used to ablate material from separate targets for concurrent deposition on a common substrate. The targets may include, but not limited to polymers, organics, inorganics, nanocrystals, solutions, or mixtures of materials. A target may be disposed on a tiltable mount to adjust the direction of the ablation plumes. Multiple ablation modes may be concurrently employed at the various targets, including, but not limited to pulsed laser, MAPLE, IR-MAPLE and other modes. The system may include a camera and processor for plume axis determination and feedback control of the plume axis by controlling a tilt of a target holder. Maple target loading sequences and liquid states are described. Fluorescent image monitoring is described.

8 Claims, 28 Drawing Sheets

Related U.S. Application Data continuation-in-part of application No. 14/158,567, filed on Jan. 17, 2014, now abandoned.

(60) Provisional application No. 61/850,330, filed on Feb. 14, 2013.

(51) Int. Cl.
  *H01S 3/094* (2006.01)
  *B23K 26/06* (2014.01)
  *C23C 14/28* (2006.01)

(52) U.S. Cl.
  CPC .... *H01S 3/094076* (2013.01); *B23K 26/0652* (2013.01); *C23C 14/28* (2013.01)

(58) Field of Classification Search
  CPC ....... C23C 14/28; C23C 14/12; C23C 14/225; C23C 14/54; B05D 1/60
  See application file for complete search history.

(56) References Cited

U.S. PATENT DOCUMENTS

| | | | | |
|---|---|---|---|---|
| 2004/0232826 | A1* | 11/2004 | Liu | H04N 9/3129 313/503 |
| 2005/0067389 | A1* | 3/2005 | Greer | C23C 14/28 219/121.68 |
| 2010/0285241 | A1* | 11/2010 | Park | C23C 14/06 427/596 |
| 2017/0282214 | A1* | 10/2017 | Stiff-Roberts | B01F 3/0815 |

OTHER PUBLICATIONS

Nakata, Y., et al., "Pulsed-Laser Deposition of Barium Titanate Films and Plume Dynamics", 1998, Applied Surface Science, p. 650-654 (Year: 1998).*

* cited by examiner

MULTIPLE BEAM PULSED LASER DEPOSITION OF COMPOSITE FILMS

RELATED APPLICATIONS

This application is a continuation in part of application Ser. No. 14/506,685, titled "Multiple Beam Pulsed Laser Deposition Of Composite Films", filed Oct. 5, 2014 by Darwish et al, which is a continuation in part of application Ser. No. 14/158,567, titled "Multiple Beam Pulsed Laser Deposition Of Composite Films", filed Jan. 17, 2014 by Darwish et al, which claims the benefit under 35 USC 119(e) of provisional application Ser. No. 61/850,330, titled: "Method and Apparatus for multi-beam pulsed laser deposition of thin films," filed Feb. 14, 2013 by Abdalla Darwish et al. The above patent documents are incorporated herein by reference in their entirety.

GOVERNMENT LICENSE RIGHTS

The U.S. Government has a paid up license in this invention and the right in limited circumstances to require the patent owner to license others on reasonable terms as provided for by the terms of contract FA90550-10-1-0199, FA9550-10-1-0198 and FA9550-10-1-0068 awarded by Air Force Office of Scientific Research.

TECHNICAL FIELD

The present invention pertains generally to the field of deposition of thin films, more particularly to the deposition of films in a vacuum or gas atmosphere using laser ablation of source material.

BACKGROUND

There is a great need for composite films deposited on different substrates. Applications vary from miniature chemical and biosensors, light emitters, detectors of e-m radiation from IR to gamma, etc. Unique features of the pulsed laser deposition (PLD), such as control of film thickness with good accuracy, uniform coating, and good control of the film composition.

Current techniques are highly dependent on specific materials and laser wavelengths that have been found to be useful. Thus, there is a need for improved techniques that provide good performance with a wider range of materials and produce films of good uniformity and composition.

BRIEF DESCRIPTION

The present disclosure generally relates to a system and method for multiple beam laser deposition of thin films wherein separate laser beams are used to ablate material from separate targets for concurrent deposition on a common substrate. The lasers may be the same or different wavelengths, powers, or pulse rates. The targets may be similar or differing classes of materials including, but not limited to polymers, organics, inorganics, nanocrystals, solutions, or mixtures of materials. One or more targets may be disposed on a tiltable mount to adjust the direction and mixing of the ablation plumes from the multiple targets. The target surface may be scanned by moving the target in one or more axes. Multiple ablation modes may be concurrently employed at the various targets, including, but not limited to pulsed laser, MAPLE, IR-MAPLE and other modes.

One laser may be tunable to an absorption wavelength of a component of the target. The tunable laser may be for example an optical parametric oscillator laser. The system may include a camera and processor for plume axis determination and feedback control of the plume axis by controlling a tilt of a target holder.

Numerous substantial benefits may arise from the system as disclosed. Materials of differing properties may be concurrently and/or simultaneously deposited to produce a film of uniform properties. The differing materials may be ablated by processes tailored to each material, with separate selection of laser power, wavelength, fluence, and pulse rate. For example, a laser wavelength may target an absorption band of a particular target, or may be selected for minimum damage to the material. Pulse rate may be adjusted to set the material mixture ratio in the film. Target composition may be formulated for optimal ablation of each material, for example, allowing cryogenic solutions on one target and heated solids on another target.

In a further feature, one or more targets may be disposed on a pivotable mount to allow adjustment of the ablation plume taking into account interaction with other plumes for best uniform coverage of the combined ablation plumes of the various targets.

In a further feature, one or more targets may be scanned relative to the laser beam to utilize an area of the target larger than the focused laser beam. In one variation, the target may be scanned according to a raster pattern. The raster pattern may have a radial component and may have a tangential or circular component. The raster may be under computer control. In a further variation, the raster pattern may be an arbitrary pattern.

In one variation, one or more targets may be mounted on a rotatable carousel. A pivotable target mount may be disposed on the carousel and rotatable with the carousel. The target may be mounted on a linear slide on the pivotable surface of the pivotable mount. The slide axis may be oriented radially in respect to the rotation axis of the carousel, and may tilt with the pivotable surface of the pivotable mount. The linear slide and the carousel may be controllable by computer. The computer control may command back and forth radial motion incremented by rotational motion to raster scan the target. Alternatively a combination of radial and rotational motion may be used to form a rectilinear raster scan or an arbitrary scan pattern.

In one variation, the rotatable carousel may have sufficient rotation range to move multiple targets into position. For example, three targets may be set up on one or more pivotable slides. When one target is depleted, a second target on the same slide may be moved into position. Alternatively or in addition, a second pivotable slide may be moved into position. Thus, multiple targets may be utilized using the same laser beam. The multiple targets may have the same material, thus increasing the run time, or the multiple targets may have different materials, thus enabling multi-layer films.

In further variations, the disclosure includes related methods, e.g. a method for depositing a composite film on a substrate based on:
1. directing a plurality of pulsed laser sources to impinge a respective plurality of targets and produce a respective plurality of plumes, each target of said respective plurality of targets containing a respective material for deposition on said substrate;
2. orienting said respective plurality of targets to direct each plume of said respective plurality of plumes to a plume mixing volume in front of said substrate;

3. triggering said plurality of laser sources to produce respective plumes concurrently in time to mix said plumes in said plume mixing volume front of said substrate and concurrently deposit said respective materials to produce a composite layer on said substrate.

VARIATIONS

In a further variation, a MAPLE target holder may be initially disposed in a vacuum chamber initially at ambient pressure with ambient air containing ambient water vapor. The target holder being disposed to contain liquid solution. The target holder may then be filled with liquid target solution at ambient temperature. The vacuum chamber may then be closed. The chamber may then be evacuated at least partially. The liquid target may then be cooled and frozen to a solid state. The target holder is then oriented to a slanted or vertical position.

In one variation, a dry purge gas may be introduced before the chamber is evacuated.

In a further variation, the MAPLE target material may be evaporated by the laser while in liquid state, without being frozen. The liquid may be cooled without achieving a frozen state. The liquid may be supplied to the target holder during a deposition process. The supply may be in response to a liquid level sensor responsive to the level of the liquid in the holder. In one variation, the substrate may be heated by a substrate heater to a temperature that prevents condensation of the liquid solvent component of the solution.

In a further variation, liquid may be supplied to the top of a frozen target to fill a crater in the frozen target.

In a further variation, external illumination may be directed to the plume and a camera may be directed to the plume to capture images of the plume as illuminated by the external illumination. The camera images may then be processed by a processor to determine plume position and/or direction characteristics. The plume characteristics may be used to vary the target angle or substrate position or angle to maintain constant deposition characteristics.

In one variation, the external illumination excites a fluorescent response of the plume material and the camera is responsive to the fluorescent response of the plume. In one alternative, a fluorescent material is added to the solution. Exemplary fluorescent species include but are not limited to rhodamine 6G, yellow 5 (tartrazine), and DCM (4-dicyanomethylene-2-methyl-6-(p(dimethylamino)styryl)-4H-pyran).

Advantages

Conventional PLD is typically configured to produce one thin film at a time and one material at a time. Thus, producing either single layer of one material, or multiple layers of the same or different materials. As a consequence, it is very difficult to produce materials similar to an evenly doped crystal. In a conventional crystal growth process, either from a solution or melt, when the crystal is intended to be evenly doped, for instance, with transitional metal ions, the dopants take evenly spaced places in the main ion structure, or interstitial sites during the growth since both materials grow at the same time in situ. So, the need to fabricate a PLD thin film analogous to an evenly doped crystal has not been met before. The proposed method and apparatus uses at least two different beams at the same time to ablate two different materials in situ, not one after another and not alternating between targets using the same laser beam. The multiple simultaneous beams produce one composite layer at a time. Therefore, having at least two beams instead of one allows the interaction between different species, adds the ability to control the proportion of the dopant material added, and allows the dopant ions to migrate and settle in their position in the crystal. The two beams thus allow improved accuracy of the control of the process to tailor the properties of doped thin film in a desirable way. The overlap of the plumes, may be perfected by adjusting the tilt of the target holders.

Industrial Applications

The apparatus and method can be used in commercial applications using polymer nano-composite coatings, such as (a) chemical and bio-sensors (polymers doped with indicator dyes and metal nano-particles for chemical sensing or polymers doped with antibodies and nano-particles for bio-sensing); (b) fluorescent coatings and scintillation radiation sensors (polymers doped with nano-particles of the oxides and salts of the rare earth elements) and others. The system may be of great interest to the petro-chemical industry (using sensors of hazardous chemical species), food and agriculture industries (using sensors of hazardous bio-species); nuclear power industry (miniature sensors of harmful radiation); home land security and defense (detectors of weapons of mass destruction, "dirty bombs", and improvised explosives) and others.

One exemplary use for the upconversion fluorescence films disclosed herein is for use as an anticounterfeit security feature. The film may be deposited in a particular position or pattern on an object such as a product or currency note. The film would be unnoticed by the consumer under ordinary lighting. However, when illuminated by the right infrared illumination, the film would emit a visible green or blue light, revealing the pattern to a security screener and verifying authenticity. A product failing to contain the mark would be likely to be a counterfeit.

Further Variations

In one variation, one or more of the lasers may be a tunable laser, tunable to an absorption peak or away from an absorption peak of a component of the target to select the energy absorption mechanism. This may help minimize damage to a deposited component of the target. An exemplary tunable laser includes, but is not limited to an optical parametric oscillator laser.

In a further variation, a camera may observe the plume and a processor may process image data from the camera to identify a plume axis or direction. The processor may compare the direction with a desired direction and control the tilt angle of the target holder to correct the plume direction.

The processor may identify the plume direction by thresholding the plume image information to identify an outline and compare the outline to an ellipse to find a best matching ellipse. Then the ellipse axis may be used as the plume axis for correction feedback.

Alternatively, the processor may find a centroid and first and second moments of the area within the outline to identify an axis direction. Alternatively a feature of the plume outline, for example but not limited to, centroid or maximum distance from the laser spot on the target, may be used to draw an axis from the laser spot through the feature of the plume to identify an axis for correction feedback.

In a further variation the system may include a two axis beam steering control for a beam of a laser; wherein the two axis beam steering control is configured to scan the beam of the laser across said respective target for efficient utilization of said respective target.

In a further variation, a multiple axis substrate holder may be used to orient a substrate article for deposition on multiple sides of the substrate.

These and further benefits and features of the present invention are herein described in detail with reference to exemplary embodiments in accordance with the invention.

BRIEF DESCRIPTION OF THE FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Laser Deposition Basics

Figure 1:
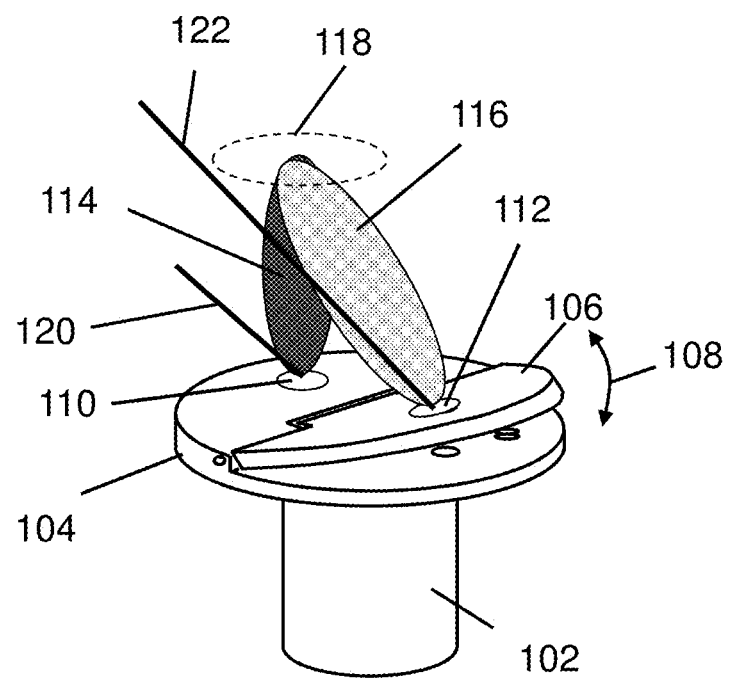
FIG. 1 presents a schematic of an exemplary dual pulsed laser deposition system in accordance with the present disclosure.

The currently existing laser deposition techniques for polymers can be listed in chronological order of their introduction:

(1) pulsed laser deposition with UV laser (UV-PLD);

(2) matrix-assisted pulsed laser evaporation (MAPLE); and (3) resonant infra-red pulsed laser deposition (RIR-PLD).

UV-PLD is historically the first method used to deposit polymeric films. Its major difference from PLD for inorganic films is the use of UV radiation either from excimer lasers (193-351 nm) or the 3-rd (355 nm) and the 4-th harmonics (266 nm) of Nd:YAG laser. This is due to the fact that UV radiation is strongly absorbed by most of the polymers. Despite the extensive list of polymer deposited by PLD, the use of PLD for deposition of organic and polymeric materials has provided mixed results at best. Moreover, despite the large number of variables explored in the deposition parameter space by researchers, the quality of the films produced by PLD has only been optimal for a very small number of systems. By using a UV laser in order to ablate various polymeric targets, it is not surprising that the resulting films will tend to show some degree of irreversible decomposition or damage. Given the fact that in these materials the chemical bonds have energies well below the UV photon energies, some degree of photochemistry is expected to occur during the PLD process. Only for a small group of addition polymers such as PTFE, PMMA, etc., does the absorbed UV radiation cause photothermal depolymerization of the starting material resulting in the reversible unzipping of the polymer chains. More often than not, however, the interaction of the UV photons with the polymeric or organic molecules will cause the loss or decomposition of functional groups, or in the case of condensation polymers, the resulting photochemistry will be responsible for the substantial modification of the starting material. Such modifications might be acceptable for some applications, but in general the use of lasers for depositing thin films of polymers requires more subtle approaches than those offered by PLD alone.

MAPLE has recently been demonstrated and promoted by the research team at the Naval Research Laboratory. MAPLE is a variation of conventional PLD. MAPLE provides, however, a more gentle mechanism for transferring polymers from the condensed phase into the vapor phase. In MAPLE, a frozen matrix consisting of a dilute solution (1-5%) of a polymeric compound in a relatively volatile solvent is used as the laser target. The solvent and concentration are selected so that first, the material of interest can dissolve to form a dilute, particulate free solution, second, the majority of the laser energy is initially absorbed by the solvent molecules and not by the solute molecules, and third, there is no photochemical reaction between solvent and the solute. The light-material interaction in MAPLE can be described as a photothermal process. The photon energy absorbed by the solvent is converted to thermal energy that causes the polymer to be heated but the solvent to vaporize. As the surface solvent molecules are evaporated into the gas phase, polymer molecules are exposed at the gas-target matrix interface. The polymer molecules attain sufficient kinetic energy through collective collisions with the evaporating solvent molecules, to be transferred into the gas phase. By careful optimization of the MAPLE deposition conditions (laser wavelength, repetition rate, solvent type, concentration, temperature, and background gas and gas pressure), this process can occur without any significant polymer decomposition. The MAPLE process proceeds layer-by-layer, depleting the target of solvent and polymer in the same concentration as the starting matrix. When a substrate is positioned directly in the path of the plume, a coating starts to form from the evaporated polymer molecules, while the volatile solvent molecules are evacuated by the pump in the deposition chamber. By using MAPLE and PLD together, laser-based techniques could produce polymer nanocomposite films by sequential deposition of polymer and nanoparticle components. Moreover, MAPLE targets can be prepared by adding nanocomponents to the polymer solutions at desired proportions that will be preserved in the deposited nanocomposite film. Using the latter techniques, research team at the University of Virginia has recently fabricated polymer nanocomposites of PMMA and carbon nanotubes (CNTs) with MAPLE. MAPLE targets were prepared by first dissolving PMMA in toluene at a concentration of 3 wt. % using ultrasonication. Composite solutions were produced by adding CNTs to pre-mixed PMMA-toluene solutions to achieve CNT concentrations of 0.1 wt. % relative to the toluene and approximately 3 wt. % relative to the deposited PMMA. Solutions were then poured into Cu target cups and flash frozen using liquid nitrogen. Due to the relatively low melting point of toluene (178 K), liquid nitrogen cold stage was used to maintain the target temperature at approximately 120 K during depositions. The deposition chamber was initially pumped down to a base pressure of approximately $3.3 \times 10^{-3}$ Pa, and then backfilled to 13.3 Pa using Ar gas. A continuous flow of Ar was bled into the chamber at a rate of 12 sccm (standard cubic centimeters per minute) for the duration of each deposition. The pressure in the chamber was maintained at 13.3 Pa by dynamically throttling the gate valve of a turbo pump system affixed to the chamber. Targets were irradiated at a fluence of 0.30 J/cm2 with a pulsed excimer laser (248 nm wavelength, 25 ns full pulse width at half maximum) operating at a frequency of 5 Hz. The laser beam was rastered across the target surface during the deposition to reduce repetitive irradiation effects. The films were deposited onto p-type, single crystal Si substrates positioned approximately 7 cm from the target. Substrates were heated to temperatures of 315, 337, 359, 381, 403, or 425 K for the duration of each deposition. Substrate heating was found to reduce the surface roughness of the nanocomposite films.

Resonant infrared pulsed laser deposition (RIR-PLD) is a variant of conventional PLD in which the laser is tuned to vibrational modes in the target material. The intense laser irradiation is used to promote the solid phase material to a highly vibrationally excited gas-phase species in the ground electronic state that can be collected on a nearby substrate as a thin film. In the absence of electronic excitation, the complex chemical and physical structure of the organic material is preserved. So far, this approach has been used with polymers in the mid-infrared wavelength range (2-10 µm). Typical chemical bonds and their vibrational modes that have been utilized in RIR-PLD are O—H stretch (vibrational mode wavelength 2.90 µm), C—H stretch (vibrational modes 3.28, 3.30, 3.38, 3.40, 3.42, and 3.45 µm), and C—O stretch (8.96 µm). One variation uses a MAPLE target in the form of emulsion of solvent and ice. RIR-MAPLE used laser radiation at a 2.94 nm in strong resonance with vibrational mode of the hydroxyl O—H bonds in the ice component of the emulsion matrix. In this way, the types of materials that can be deposited using RIR-MAPLE have been significantly expanded. Furthermore, materials with different solvent bond energies can be co-deposited without concern for material degradation and without the need to specifically tune the laser energy to each material solvent bond energy, thereby facilitating the realization of organic/inorganic hybrid nanocomposite thin-films.

Dual Pulsed Laser Deposition System

The present disclosure relates to a system and method for multiple beam laser deposition of thin films wherein separate laser beams are used to ablate material from separate targets for concurrent deposition on a common substrate. The system results in numerous advantages including, but not limited to:

1) Multiple high-power pulsed laser beams of a variety of wavelengths that can be simultaneously applied to separate targets to deposit a composite film on the same substrate.

2) Variable angle of each target with respect to its laser beam in order to achieve the adjustment of the position and the angle of the corresponding plume with respect to the substrate in order to optimize the size of the region over the substrate where multiple plumes overlap and deposit the composite film of a variable proportion between the components.

3) Combination of the variable angle of the target surface with target lateral motion (with respect to the laser beam) for rastering (i.e., raster scanning) of the target surface to provide smooth and uniform deposition.

4) A rotating target stage capable of switching targets for the laser beams.

5) The target stage combined with the means of target cooling, for example, cooling to the temperature as low as the temperature of liquid nitrogen suitable for typical MAPLE and RIR MAPLE processes.

The apparatus and the method enable:

1. Creating polymer nano-composite films of more uniform mixture of the components because they are simultaneously deposited on the substrate form multiple targets hit by multiple laser beams.

2. Creating polymer nano-composite films of more uniform thickness and distribution of the components along the film due to optimized overlapping of the plumes from multiple targets achieved by the variation of the tilt of each target with respect to its laser beam.

3. Improving the uniformity of the film also due to combination of the lateral motion of the target with respect to its laser beam to achieve rastering and uniform consumption of the target material.

4. Achieving better quality of the polymer (less proportion of monomers and polymer fragments) coating due to the use of MAPLE or RIR MAPLE techniques provided by the cooling stage.

5. Widening the variety of the possible coatings by switching the targets between different laser beams with the use of the rotary target stage.

Variable Tilt Target Holder

The method uses a new concept of variable tilt of the target in order to change the position of the plume with respect to the substrate and optimize the overlapping between the plumes of different targets.

Exemplary Multiple Pulsed Laser Deposition System

An exemplary multiple pulsed laser deposition system will now be described in detail with reference to the drawings.

Figure 2:
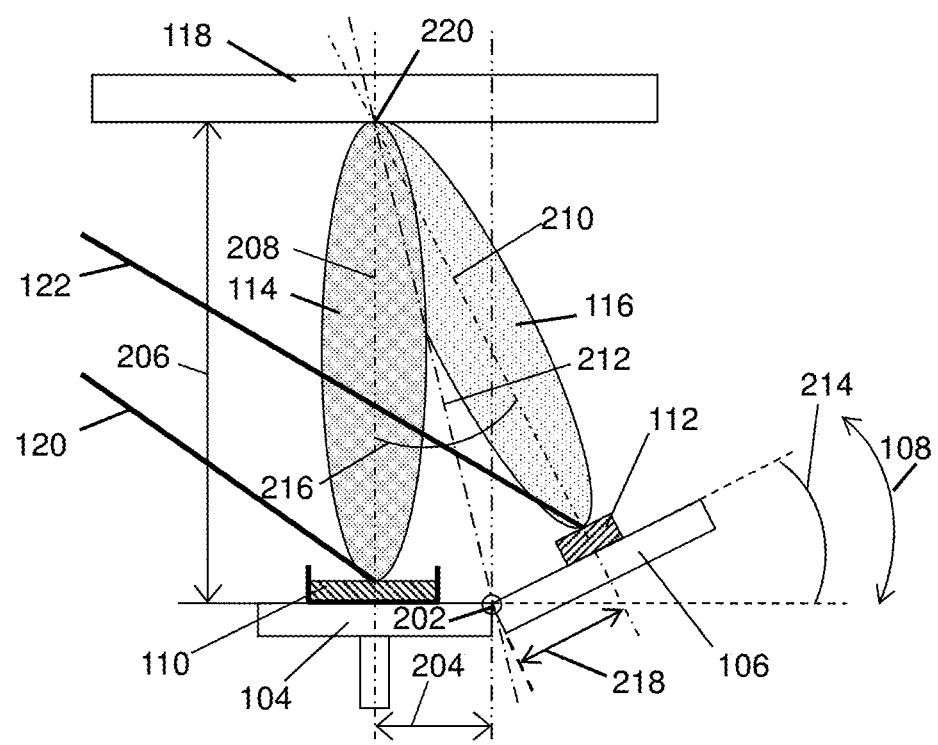
FIG. 2 shows a cross section view of the system of FIG. 1.
Figure 3:
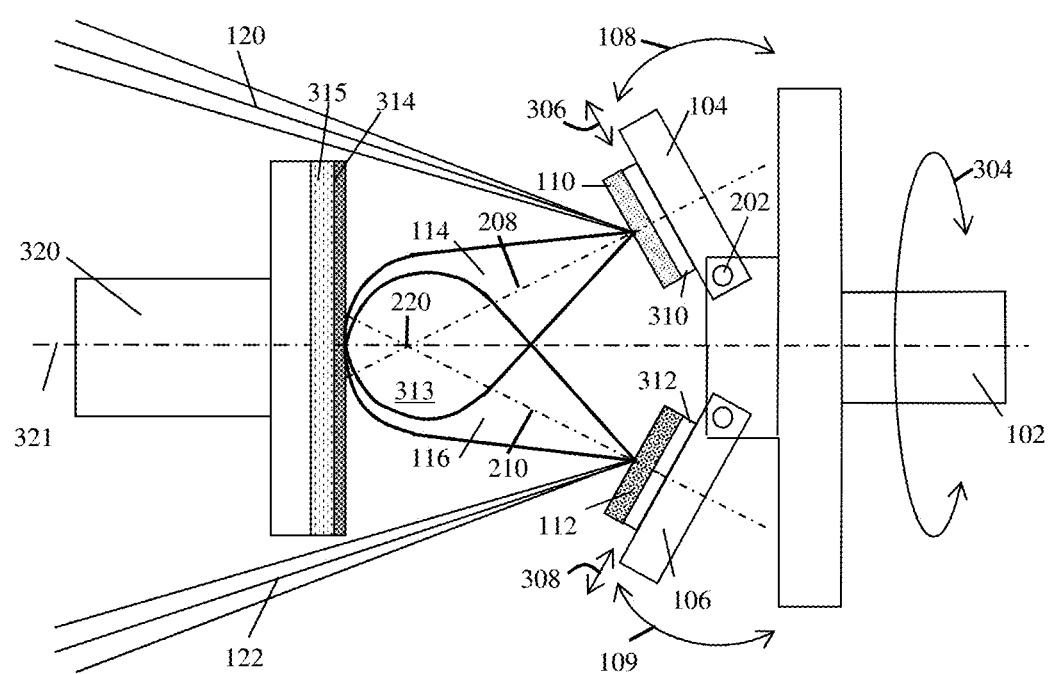
FIG. 3 depicts an exemplary schematic diagram of an alternative multiple laser system and illustrates additional optional features.

FIG. 1 presents a schematic of an exemplary dual pulsed laser deposition system in accordance with the present disclosure. FIG. 1 illustrates an exemplary target carousel 104 configured to accommodate two separate targets 110, 112 illuminated by two separate laser beams 120, 122. The separate laser beams may have wavelength, energy, fluence, and focus properties individual tailored for each separate respective target. A first target 110 is shown mounted on a rotatable carousel 104. A second target 112 is shown mounted to a tiltable platform 106 on the rotatable carousel 104. The two lasers 120, 122 may produce a first plume 114 and second plume 116 when directed to the respective targets. The two plumes are directed to interact and co-deposit their respective materials on a substrate 118. The tiltable platform 106 may be adjusted to a tilt angle 108 to direct the second plume 116 for optimum interaction with the first plume 114 and even co-deposition of material on the substrate 118. Note, the plumes 114 and 116 depicted in FIG. 1-FIG. 3 are not intended to be accurate drawings of plumes, but only indicative of a region of plume development. The actual plumes continue to develop and deposit material over a substantial portion of the substrate.

FIG. 2 shows a cross section view of the system of FIG. 1. Referring to FIG. 2, FIG. 2 shows the first laser beam 120; the second laser beam 122; the first target 110 and second target. 112. The first target 110 may be, for example but not limited to frozen polymer solution in case of MAPLE. The second target 112 may be, for example but not limited to a compressed pellet of the powder of an upconversion inorganic material. FIG. 2 further illustrates the holder of the first target 104 may optionally be cooled with liquid nitrogen as desired for MAPLE, for example, and the holder 106 of the second target configured with a hinge 202 to allow variable or adjustable tilt along arc 108. The first target 110 and second target 112 produce respective plumes 114, 116 normal to the surface of each target. The plumes have a respective first axis 208 and second axis 210 normal to the surface of the target at the center of the laser spot. A bisector 212 of the angle 216 between the first and second axis may preferably pass through the hinge 202 axis. A tilt angle 214 is shown. A distance 206 from the tilt axis (hinge axis) to the substrate is shown, and a first plume offset distance 204 from the first plume axis to the hinge axis and perpendicular to the plume axis is also shown. In one exemplary variation, a second plume offset distance 218 is equal to the first plume offset distance 204.

The pulsed laser deposition includes the sequence of the processes:

(a) heating the target with the laser pulse;
(b) melting the heated target material followed by its vaporization;
(c) ionizing the atoms of the vaporized target material by the electrons accelerated in the strong electric field of the laser pulse and creating weakly ionized plasma;
(d) expansion of the plume made of the weakly ionized plasma driven by electrostatic repulsion of the positive ions of the target material towards the ambient gas or vacuum separating the target from the substrate;
(e) condensation of the target material from the plume on the substrate and thin film formation.

Since the spread of the plume is driven by electrostatic repulsion, the axis of the plume is normal to the surface of the target regardless of the direction of the incident laser beam. The optimal tilt can be understood from FIG. 2. The target holder is split in two halves: the static holder 104 of the first target 110 and holder 106 of the second target 112 with variable tilt. Holder 106 rotates around hinge 202. The optimal tilt angle θ is reached when the plumes from both targets overlap on the substrate 118, in other words, their axes 208 and 210 intersect on the surface of substrate 118. One can see from FIG. 2 that tilt angle 214 is equal to angle 216 between axes 208 and 210 of the plumes. In case the spots of the targets where the laser beams hit have the same distance from hinge 202, bisector 212 of angle 216 passes through hinge 202 and the point 220 on the surface of substrate 118 where axes 208 and 210 of both plumes intersect. Correspondingly, a desired tilt angle can be calculated as $$\theta = 2\tan^{-1}\left(\frac{d}{l}\right), \quad (1)$$

where,

θ is the desired tilt angle;

d is the distance between the spots of the targets exposed to the laser beams and hinge 212 (distances 204 and 218 in FIG. 2); and l is the distance between stationary target holder 6 and substrate 118 (distance 206 in FIG. 2).

The desired tilt angle can be pre-set before the laser deposition and adjusted around the pre-set value during the laser deposition process in order to correct possible errors related to the shift of the laser beams along the targets, change of the distance between the targets and the substrate, etc. In one embodiment of the invention, the distance l between substrate 118 and target holder 110 was 1 inch (2.54 cm) and distance d was 0.25 inch (0.635 cm). Correspondingly, the desired tilt angle was 14.0 degrees.

The tilt angle θ may be refined by running test samples with various angles around 0 to determine an optimum angle. According to one criterion, the best angle would be the angle that gives the most uniform coverage over a given area of the substrate.

The rotation axis of hinge 202 may vary, but is preferably parallel to the plane of the surface of the substrate 118 and is also preferably perpendicular to a plane containing the two plume axes 208, 210. Alternatively the hinge axis may be perpendicular to a plane containing the plume axis 210 and a center axis of the substrate, perpendicular to the substrate. Such axis coincides with axis 208 in FIG. 2 and axis 321 in FIG. 3.

FIG. 3 depicts an exemplary schematic diagram of an alternative multiple laser system and illustrates additional optional features. For ease of discussion, only two laser beams 120 and 122 are shown in the figure. Additional beams and additional targets may be added. Referring to FIG. 3, beams 120 and 122 strike targets 110 and 112 respectively. Targets 110 and 112 are mounted on target holders 310 and 312 respectively. The target holders are mounted on bases 104 and 106 respectively. The bases are mounted on a cooling stage 102. The substrate stage 320 is placed in front of the targets. The laser beams strike the targets and create plumes of their materials 114 and 116 respectively that overlap in region 313 (also referred to as a mixing volume 313) over deposited film 314 on substrates 315. FIG. 3 shows an alternative tilt angle wherein the plume axes intersect in front of the substrate at location 220. Location 220 is typically close to the substrate and past half way from the target 110 to the substrate 315. The cooling stage can rotate around its axis 321 along direction 304 to facilitate switching the targets and/or rastering. Target holders 310 and 312 can move in lateral directions 306 and 308 with respect to the corresponding laser beams to facilitate rastering and uniform exposure of the targets to the laser beams. Bases 104 and 106 tilt along directions 108 and 109 respectively to adjust overlapping region 313 between the plumes. In one variation, the bases 104 and/or 106 may be adjusted by external controls while under vacuum in the chamber.

Pulsed Laser Ablation/Deposition System

Figure 4:
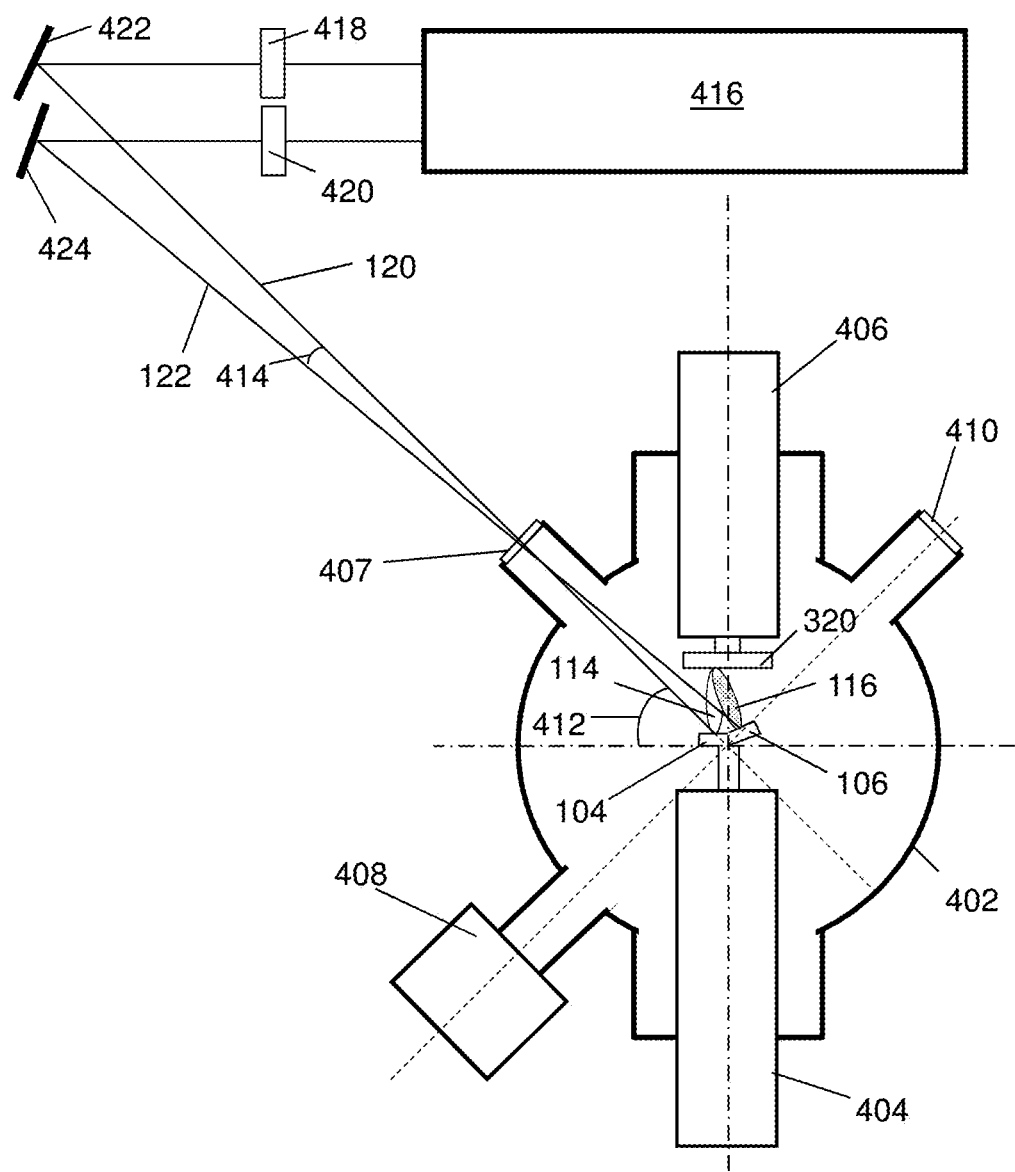
FIG. 4 is a top view of the DPLD system, which shows the two laser beams with respect to the target holder with two targets.

FIG. 4 shows a top view of an exemplary PLD setup of a dual laser beam deposition system that includes a pulsed laser and vacuum chamber. Referring to FIG. 4, the spherical vacuum chamber 402 provides access and mounting ports for various components of the system. Target manipulator 404 holds target carousel 104 (and the holder of the first target 110—not shown) and the second tilted holder 106 of the second target 112 (not shown). Substrate manipulator 406 holds target stage 320. Flange 407 with optical window is the optical port for laser beams 120 (1064-nm wavelength) and 122 (532-nm wavelength). RHEED device 408 is attached to the vacuum chamber to monitor the thickness of the deposited film. Flange 410 with optical window is for observation and mounting a video camera. 412 is the angle (45°) between the first laser beam 120 and the horizontal axes of the chamber. 414 is the angle between the two laser beams. Laser 416 (Nd:YAG Q-switched laser with the second harmonic generation unit) generates the two pulsed laser beams. Computer controlled optical shutters 418 and 420 independently block the laser beams in a controllable way in order to regulate the mixing proportion of the materials of both targets in the deposited film. Tilting mirrors 422 and 424 control the positions of the laser beams on the corresponding targets. They may be motorized to provide rastering of the laser beams along the targets.

Plume Characteristics

The plume size varies from 2.5 cm to 4 cm. Once the plasma is formed, the plume propagated from the target towards the substrate. Overlapping region of the two plumes is the location of the chemical or physical (in our case) interaction between the ions of the component materials resulting in a homogenous mixed plume forming the thin film.

The typical velocity of the plume front is ~$5 \times 10^3$ m/s. The front of the plume typically reaches a substrate at a distance of 5 cm from the target in 10 μs after the laser pulse. The density of the plume (number of ions per unit of volume) is the highest near the target and decays gradually towards the substrate at any given time after the laser pulse. The maximum density near the target is of the order of $3 \times 10^{17}$ ions/cm$^3$. When the plume expends in the ambient gas at a typical pressure of up to 200 mTorr, its front creates a shock wave in the gas. The plume distribution becomes less gradual and more square-type with abrupt drop of the ion density near the region where the shock wave is formed. In this region the pre-mature condensation of the target material can occur. At higher pressure of the ambient gas, the pre-mature condensation can happen before the plume reaches the substrate. Experimental observation of the plume dynamics can be performed with the ion (Langmuir) probe or with a high-speed video camera detecting the glow of the plume. The plume always expends in the direction normal to the surface of the target. The angle of the incidence of the laser beam can vary, depending on the actual configuration of the deposition chamber. Typically, at higher incidence angle more of the laser energy is reflected without being dissipated in the target. Accordingly, the less incidence angle (the laser beam direction close to the normal to the surface of the target) is preferred for delivering more laser beam energy to the target.

The gas pressure and/or the gas type may accelerate or enhance the formation of the thin film. The angle of incidence of each plume is adjusted to produce the maximum overlap of the two plumes.

Rastering

Rastering of the laser beam over the target is used to avoid forming a crater in one spot of the target and cracking it before the film is completed. Rastering can be achieved by moving the target and keeping the laser beam fixed, as previously described in FIG. 3. Alternatively, rastering can be achieved by a slight vibration of one of the mirrors in the laser beam delivering optical channel to force the beam to travel over the target and ablate it evenly (see FIG. 4). Variation of beam position can periodically change the overlapping conditions of the plumes, but also can make the resulting film formed on the surface more even. The size of the laser spot may be any desired size, however, typically does not exceed 1 cm$^2$. The laser pulse may be any energy level necessary for a particular target, however, an exemplary laser beam may typically deliver about 1 J of energy in such a spot (the exemplary energy density may be about ~1 J/cm$^2$).

Typically, the laser pulse repetition rate varies from 1 to 10 Hz. Typical laser pulse duration is ~10 ns. The laser power density is accordingly ~0.1 GW/cm$^2$ or higher (for more focused laser beam).

Deposition Monitor, RHEED

The popular method of real-time monitoring of the growth of inorganic monocrystalline films during the PLD process is based on the reflected high energy electron diffraction (RHEED). RHEED instrument is installed in the exemplary vacuum PLD chamber. Periodic oscillations of the brightness of individual diffraction spots in the electron diffraction pattern in the fluorescent screen give exact account of the number of the atomic layers being formed in a highly ordered ultrapure thin monocrystalline film. Each peak in the oscillating spot brightness represents the forming of a new monolayer. Since the degree of order is at a maximum once a new monolayer has been formed, the spots in the diffraction pattern have maximum intensity since the maximum number of diffraction centers of the new layer contribute to the diffracted beam. The overall intensity of the oscillations is dropping the more layers are grown. This is because the electron beam was focused on the original surface and gets out of focus the more layers are grown.

Each full period corresponds to formation of a single atomic layer. The oscillation period is highly dependent on the material system, electron energy and incident angle, so researchers obtain empirical data to correlate the intensity oscillations and film coverage before using RHEED for monitoring film growth. Since the polymer nano-composite films are not perfectly ordered or rather perfectly disordered (amorphous), more suitable can be, for instance, a standard oscillating quartz plate monitor placed next to the substrate. Post-depositions methods might include atomic force microscope (which was used in our experiment), stylus profilometer, optical interferometric microscope (for the films with a thickness of fractions of a micron), and optical reflectometer. The laser deposition process can be calibrated by relating the thickness of the film measured after the deposition to the number of the laser pulses used. In such a way the thickness of the film can be controlled by selecting a certain number of the laser pulses used.

C. Method

Referring to FIG. 3, an exemplary process will now be described comprising the following steps:
1) Targets are prepared, pre-cooled and preserved in solid state.
2) Targets 110 and 112 and substrate 315 are mounted on their holders.
3) Vacuum is created in the vacuum chamber and a carrier gas is fed in.
4) The targets are exposed to the corresponding laser beams.
5) Bases 104 and 106 are tilted in order to obtain a desirable overlapping region 313 between plumes 114 and 116.
6) The PLD process is conducted until film 314 of a desirable thickness is obtained on substrates 315.
7) The laser beam illumination and target selection can be varied to vary the mixture of the composite film 314 across the thickness of the film.
8) The laser beams can be attenuated to achieve different proportions of the components in the composite film.
9) Bases 104 and 106 can be tilted along directions 108 and 109 respectively in order to achieve the optimal overlapping region 313 of plumes 114 and 116 over substrate 315.
10) Stage 102 can be rotated along direction 304 around its axis to switch the targets between the beams.
11) Target holders 310 and 312 can move along directions 306 and 308 lateral to the respective beams in order to achieve rastering and uniform consumption of the target materials.

D. Alternate Embodiments

In one alternative embodiment, target 110 can be made of solid polymer, such as poly(methyl methacrylate) known as PMMA and target 112 made of metal, such as gold. Laser beams 120 and 122 can be of the same wavelength, such as 1064 nm (the fundamental harmonic of an Nd:YAG laser) or can have different wavelengths: 255 nm (the 4-th, UV harmonic of the Nd:YAG laser) for the polymer target 110 and 532 (the 2-nd, visible harmonic of the Nd:YAG laser) for metal target 112.

In yet another alternative embodiment, the target 110 is made of polymer PMMA dissolved in as solvent, such as toluene or chlorobenzene, and frozen to a solid state in liquid nitrogen. Then the target is mounted on cooling stage 102 continuously cooled with circulating liquid nitrogen. Then the target is exposed to the UV laser beam to implement the matrix assisted pulsed laser evaporation (MAPLE) process in which the frozen solvent dissipates the energy of the UV laser into heat transferred to the polymer that evaporates without dissociation and condensates on substrate 315 together with the material from the second target 112 to form a polymer nano-composite film 314.

In yet another alternative embodiment, the number of targets and laser beams of different wavelengths are more than two to implement PLD of multi-composite films.

In yet another alternative embodiment, the first laser wavelength is chosen to be in the mid-IR, namely in resonance with the frequency of the vibrational modes of the polymer molecules of the polymer target 110 to implement the resonance IR (RIR) PLD of polymer nano-composites, which does not cause dissociation of the deposited polymer material.

In yet another alternative embodiment the first laser wavelength is chosen to be in the mid-IR, namely in resonance with the frequency of the vibrational modes of the molecules of the frozen solvent matrix of the frozen polymer-solvent target 112 to implement the resonance RIR MAPLE of polymer nano-composites, which the most gentle laser deposition process suitable for highly sensitive polymer molecules, such as proteins or DNAs.

Dual Pulsed Laser Deposition (DPLD)

The dual pulsed laser deposition in accordance with the present disclosure enables precise control of films that would be very difficult or impractical to grow using single target techniques. The dual target, dual laser approach allows the separation of the components of a combination film and optimization of the evaporation conditions for each component. For example, each component may utilize exactly the best laser wavelength and energy for best energy absorption (resulting in efficient ablation) and minimum damage to the material, without having to be limited by the presence of the other component. Each component may separately select DPLD, MAPLE DPLD, or other techniques for optimum ablation of each component. Also, the rate of deposition for each component may be separately controlled. This is especially applicable where one component may be an organic polymer and the other component may be an inorganic nanocrystal. The organic polymer may be advantageously deposited using MAPLE techniques; whereas, the nanocrystal may be deposited by direct laser ablation techniques.

One exemplary process and material will now be described in detail. A useful class of composite films comprises films containing nanocrystals doped with ions of rare earth (RE) elements. These RE doped nanocrystals have unique physical, chemical and optical properties particularly attributed to nanometer size of the particles. The films have great potential of being used in applications spanning from new types of lasers, especially blue and UV lasers, phosphorous display monitors, optical communications, and fluorescence imaging.

Upconversion Compounds Used for the Composite Film Deposition

One exemplary property of a class of these RE doped nanocrystals is the upconversion of optical energy, in particular, laser energy. In general, efficient hosts for energy upconversion may be based on materials with low phonon energies which minimize the non-radiative multi-phonon relaxation process of the RE dopant. A desirable exemplary group of efficient upconversion phosphors is based on fluorides which are doped with $Yb^{3+}$ and $Er^{3+}$ or $Yb^{3+}$ and $Ho^{3+}$ or $Yb^{3+}$ and $Tm^{3+}$. Hexagonal-phase $NaYF_4$ ($\beta$-NaYF$_4$) crystals is a particularly efficient host material for upconverting RE ions due to the low phonon energy of the crystal lattice.

RE doped materials of different compositions, shapes and size distributions may be prepared by various synthetic methods such as chemical vapor deposition, sol-gel process, micro-emulsion techniques, gas phase condensation methods, hydrothermal methods and laser ablation. One exemplary preparation will be described in detail. NaYF$_4$ crystals co-doped with trivalent RE ions may be synthesized using a solution based technique (wet process) in the presence of Na$_2$-ethylenediaminetetraacetic acid (EDTA). After annealing at a temperature of 400° C. or 600° C. very strong upconversion fluorescence may be observed by the naked eye. Three efficient rare-earth compounds have been developed and incorporated in polymer nanocomposite light-emitting films using DPLD:

(a) NaYF$_4$:Er$^{3+}$,Yb$^{3+}$,
(b) NaYF$_4$:Ho$^{3+}$,Yb$^{3+}$, and
(c) NaYF$_4$:Tm$^{3+}$,Yb$^{3+}$.

The micro-powders with an average grain size of ~1 µm were prepared by the wet method (described below) and compressed in solid pellets with a hydraulic press. The molar fractions of the rear earth (RE) components in all three compounds are nominally NaYF$_4$:X$^{3+}$ (1.6%), Yb$^{3+}$ (9.6%), where the host NaYF$_4$=molar 100% and X stands for Er, Ho, or Tm. The X$^{3+}$ may be molar 1.5% of the host plus or minus 0.75%, i.e., 0.75% to 2.25%, preferably plus or minus 0.5%, i.e., 1.0% to 2.0%. The Yb$^{3+}$ may be molar 9.6% of the host plus or minus 4.8%, i.e., 4.8% to 1.44%, preferably plus or minus 3.2%, i.e., 6.4% to 12.8%. It is expected that the proportions prepared in the target are transferred to the film during deposition.

The NaYF$_4$:Yb$^{3+}$, Er$^{3+}$ crystals (compound (a)) were prepared in the presence of Na$_2$-ethylenediaminetetraacetic acid (EDTA) using the co-precipitation procedure to obtain homogeneous nucleation. First 0.5 mol of NaF was dissolved in about 60 ml of water. An aqueous rare-earth chloride solution was prepared by mixing 16 ml of 0.2-mol YCl$_3$, 3.4 ml of 0.2-mol YbCl$_3$ and 0.6 ml of 0.2-mol ErCl$_3$. The YCl$_3$ solution was obtained by dissolving Y$_2$O$_3$ in hydrochloric acid and adjusting to pH 2 to avoid any hydrolysis. The rare-earth chloride solution was allowed to mix with 20 ml of 0.2-mol EDTA solution for metal-EDTA complex to occur. All the rare-earth chlorides, EDTA and NaF were obtained from Aldrich and the Y$_2$O$_3$ was synthesized in the lab using Y(NO$_3$)$_3$ and Na$_2$CO$_3$ from Aldrich. The EDTA complex solution was quickly introduced into the NaF solution and the mixture was allowed to stir vigorously for several hours. After stirring, the solution was allowed to sit overnight for the precipitate to settle. The precipitate was filtered, washed several times with distilled water and with ethanol. The precipitate was dried under vacuum to remove any traces of water. The NaYF$_4$:Yb$^{3+}$, Er$^{3+}$ crystals prepared in the above procedure did not show initially any upconversion fluorescence. However, after the dried precipitate was annealed to a temperature of 400° C. for a period of one hour, bright green upconversion was observed under 980 nm laser diode excitation. As a result, a hexagonal NaYF$_4$:Yb$^{3+}$, Er$^{3+}$ phase was obtained in addition to the cubic phase. Compounds (b) and (c) were synthesized in a similar way using HoCl$_3$ and TmCl$_3$ respectively instead of ErCl$_3$. Compounds (a) and (b) exhibited brilliant upconverted green emission (with a quantum yield of ~1%) primarily at ~540 nm and compound (c)—red emission (at ~647 nm) and blue emission (470 nm) being pumped with an infra-red pump at 980 nm. (Note: about or approximately equal to x nanometers when referring to emission peak wavelengths means within three percent.) The quantum yield (upconversion power ratio) appears to be typically from 0.1% to 1.5%)

Figure 5:
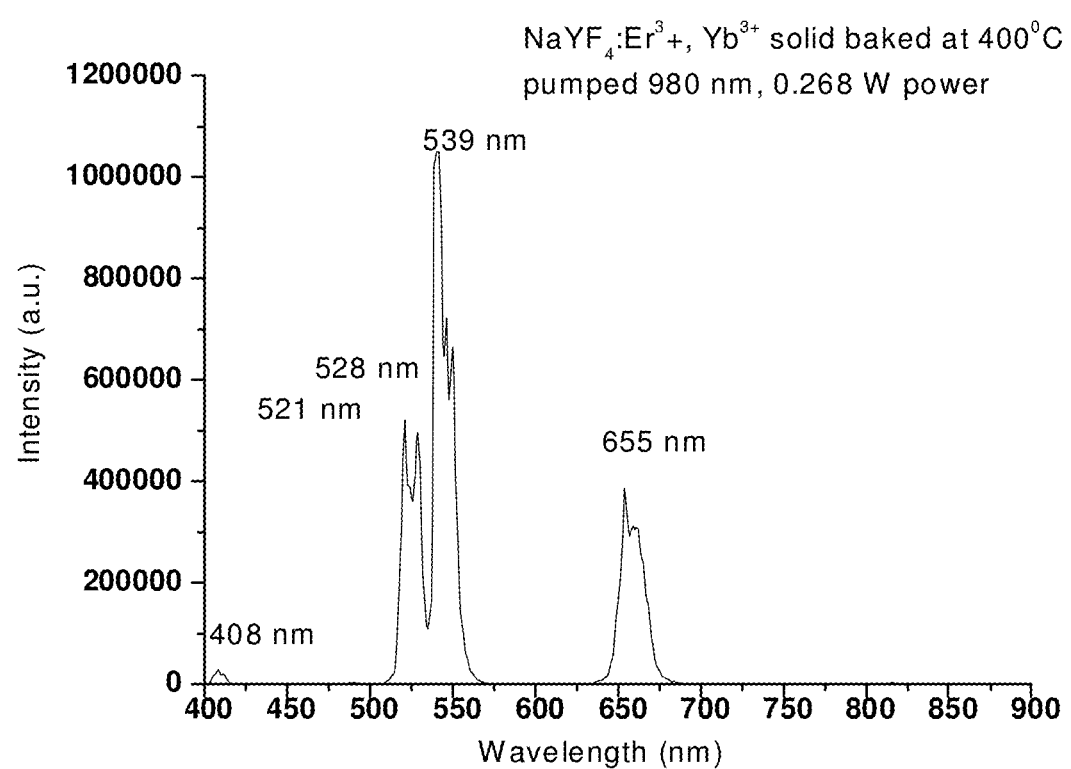
FIG. 5 shows the fluorescence spectrum of $NaYF_4:Er^{3+}$, $Yb^{3+}$ powder (compound "a") illuminated with 980-nm laser radiation.
Figure 6:
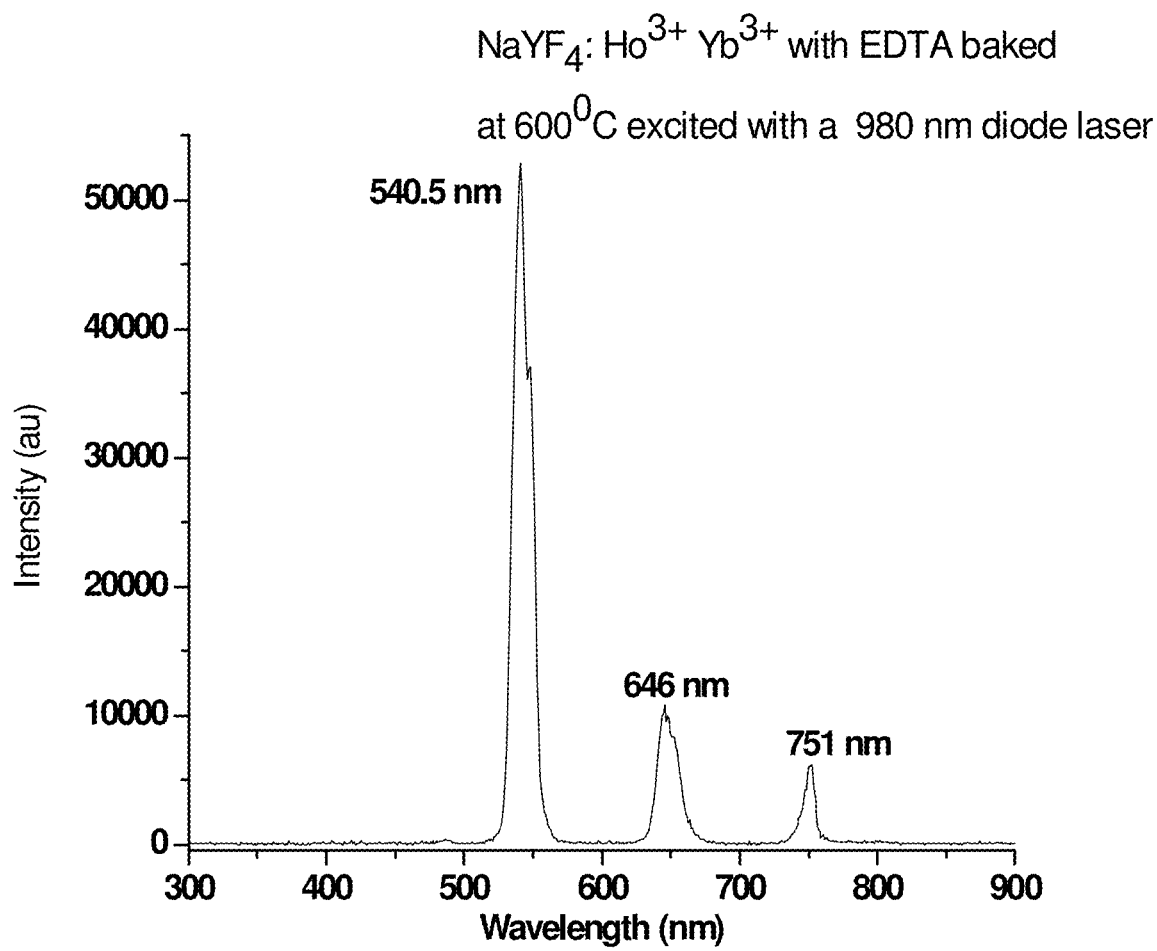
FIG. 6 shows the fluorescence spectrum of $NaYF_4:Ho^{3+}$, $Yb^{3+}$ powder (compound "b") illuminated with 980-nm laser radiation.
Figure 7:
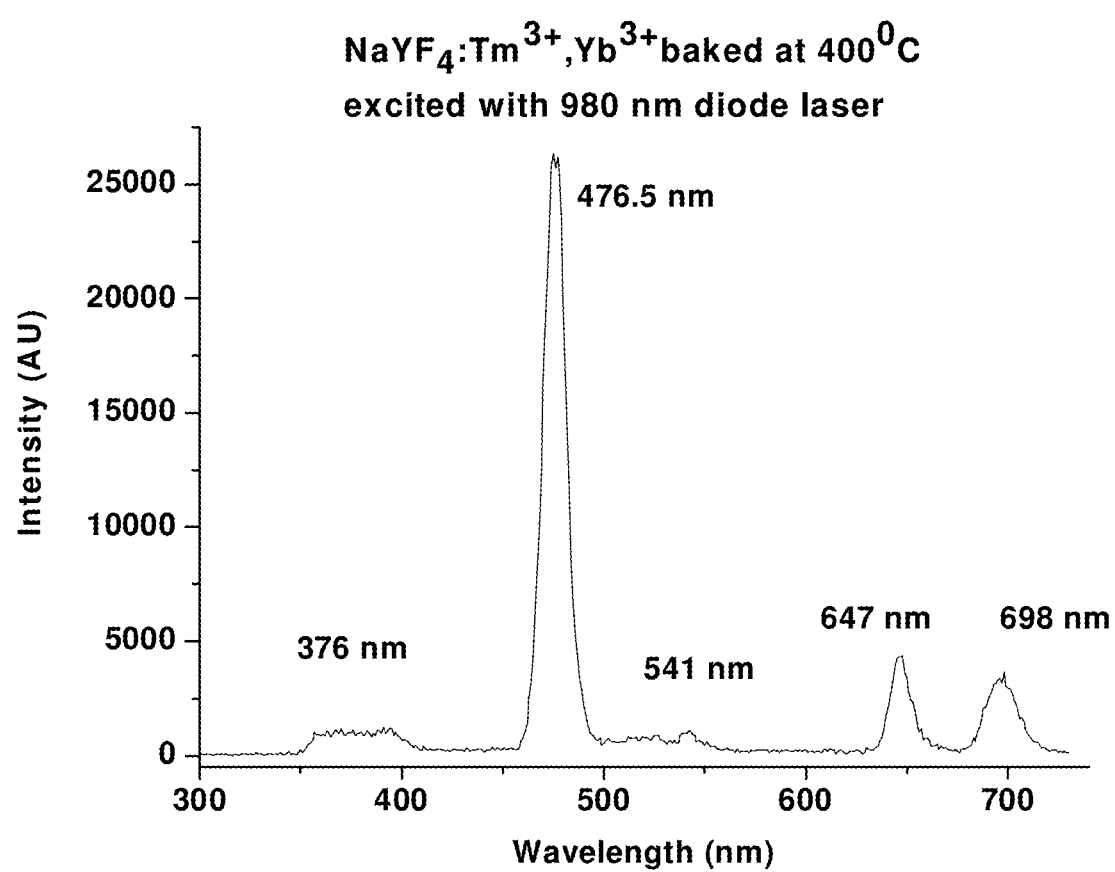
FIG. 7 shows the fluorescence spectrum of $NaYF_4:Tm^{3+}$, $Yb^{3+}$ powder (compound "c") illuminated with 980-nm laser radiation.

Optical fluorescent spectroscopy of the upconversion powders was conducted using a 980-nm laser diode PL980P330J from Thorlabs (330-mW maximum power, quantum-well laser chip, pigtailed with a wavelength stabilizing fiber Bragg grating) as a pumping source. In all the measurements, the samples were at room temperature. Optical fluorescent spectra were taken with the Princeton Instruments 500-mm-focal-length Spectra Pro (SP-2500i) imaging spectrometer/monochromator equipped with 1200 gr/mm (blazed at 500 nm) holographic diffraction grating and PI-Max 1024 HQ Digital Intensified CCD Camera system. Before the spectroscopic measurements, the crystalline powders were compressed into flat pellets. The emission measurements were made in reflectance mode using a sample chamber with the sample pellets placed approximately at an angle of 45° with respect to the optical axis of the entrance slit of the monochromator. Fluorescence spectra of the compounds are presented in FIGS. 5 through 7.

Figure 8:
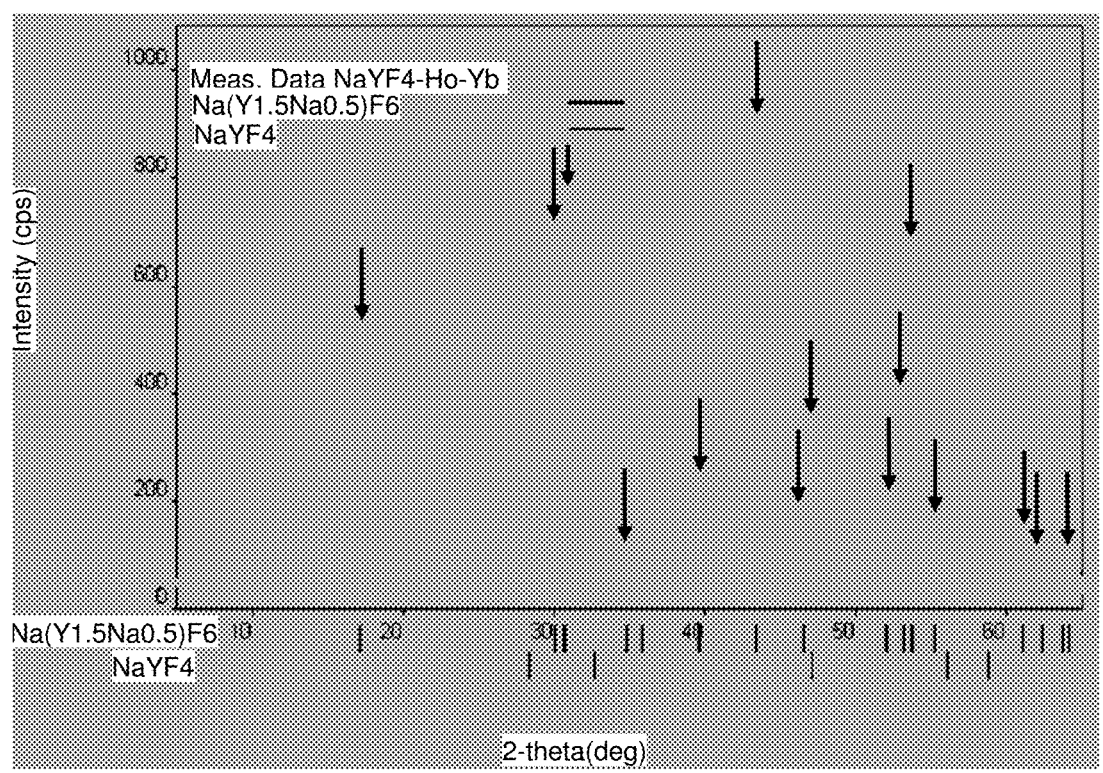
FIG. 8 shows the XRD spectrum of the powder of $NaYF_4:Ho^{3+},Yb^{3+}$ baked at 400° C. Black vertical arrows directed downwards mark the positions of the peaks in the XRD spectrum of the composite $PMMA:NaYF_4:Ho^{3+},Yb^{3+}$ film deposited using DPLD.
Figure 9:
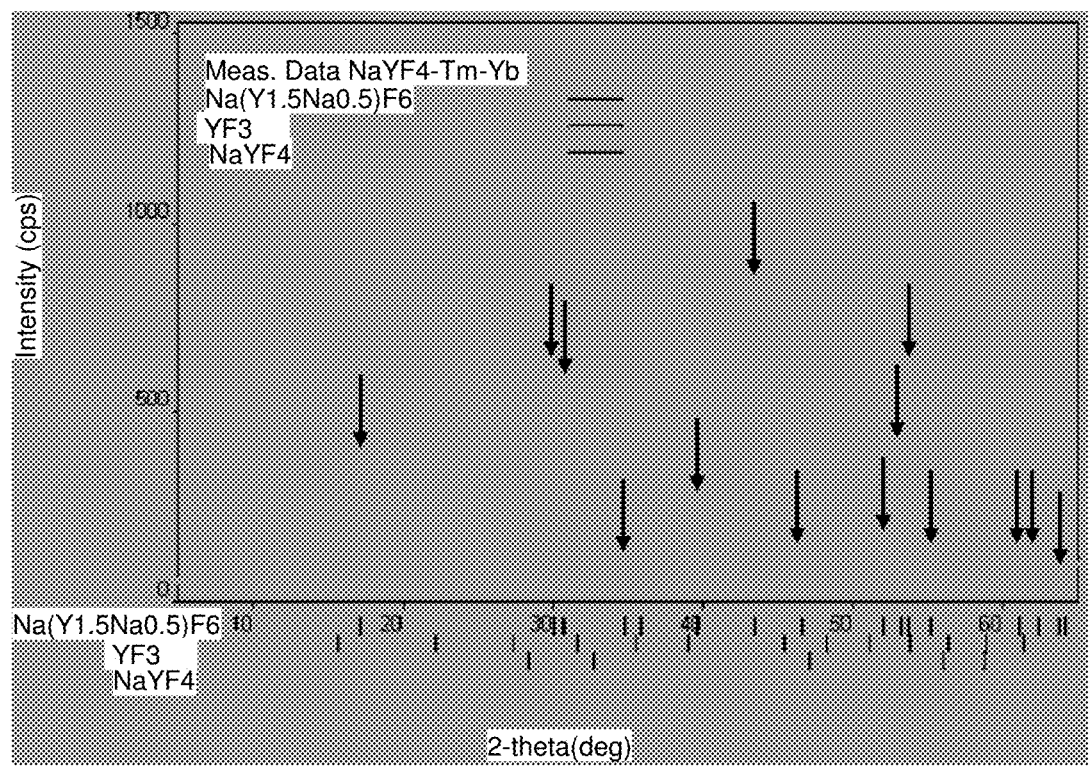
FIG. 9 shows the XRD spectrum of the powder of $NaYF_4:Tm^{3+},Yb^{3+}$ baked at 400° C. Black vertical arrows directed downwards mark the positions of the peaks in the XRD spectrum of the composite $PMMA:NaYF_4:Tm^{3+},Yb^{3+}$ film deposited using DPLD.

The X-ray diffraction (XRD) data for powders (b) and (c) taken with Bruker D2 Phaser X-ray diffractometer are presented in FIGS. 8 and 9. The data in FIG. 8 suggests that material (b) contains only two phases, hexagonal Na$_{1.5}$Y$_{1.5}$F$_6$ and cubic NaYF$_4$. The disordered Na$_{1.5}$Y$_{1.5}$F$_6$ is the majority product, but there is a much more equal ratio of the products in this sample compared to the Tm,Yb-doped sample (c) (FIG. 9). Here it appears to be about 60/40 in favor of the disordered fluoride. The two unassigned peaks at 2-thetas of 39 and 45 degrees are from the aluminum sample holder due to the small amount of the sample. Both products are highly crystalline and appear to have particle sizes above 100 nm.

From observation of FIG. 9, material (c) contains three products: Na$_{1.5}$Y$_{1.5}$F$_6$, NaYF$_4$ and YF$_3$. The main product is Na$_{1.5}$Y$_{1.5}$F$_6$. This is actually thought of as the low temperature form of NaYF$_4$, but is not written in that formulation since, crystallographically, the Y site is disordered as Na(Y$_{1.5}$Na$_{0.5}$)F$_6$. This results in hexagonal symmetry P6$_3$/m. This material is typically prepared by low temperature techniques and will convert into cubic NaYF$_4$ at 691° C. This cubic NaYF$_4$ is also present in this sample, but only as a very minor product. The third product is YF$_3$. All of the products are highly crystalline and have particle sizes greater than 100 nm.

Deposition Procedure

A sample of the solution of polymethyl(methacrylate) known as PMMA in chlorobenzene at a proportion of 1 g solids per 10 mL liquids was poured in a copper cup and frozen in liquid nitrogen. Then the copper cup with the frozen polymer solution was mounted on a double target holder (as Target 1) cooled with continuous flow of liquid nitrogen. Target 2 was made of a solid pellet prepared by compressing the powder of an upconversion powder material and retained in a holder. The laser source was a Spectra Physics Quanta Ray Nd:YAG Q-switched Lab-170-10 laser with a pulse repetition rate of 10 Hz, 850-mJ energy per pulse at the 1064-nm fundamental wavelength and 450-mJ energy per pulse at the 532-nm second harmonic. The frozen polymer Target 1 was ablated with the 1064-nm laser beam. Target 2 was ablated with the 532-nm frequency doubled Nd:YAG beam.

Pulse Timing

In one variation, the two pulses may be simultaneous, i.e., sufficiently simultaneous in time such that the two plumes interact during deposition on the substrate. This may produce the most uniform mixture as a function of depth in the film. In another variation, the pulses may be separate or interleaved. Thus each pulse deposits a layer on top of the other. This may produce a slight layering effect; however, since the layers are very thin and may be on the order of molecular thickness, the layering may be insignificant. In a further variation, there may be an unequal number of pulses from each laser as a method of controlling proportion of components. For example, there may be one pulse from a first laser followed by 20 pulses from a second laser. If each laser pulse deposits an equal amount, the film component ratio would be 1/20. Alternatively the two lasers may fire simultaneously for one pulse interval followed by 19 pulses from the second laser to produce the same 1/20 component ratio. For some films, the resulting layering may be tolerated. For other films requiring less layering, every pulse interval may comprise two simultaneous pulses to minimize or eliminate layering. Other techniques may be used to vary the component ratio, including but not limited to varying target composition, laser pulse energy, fluence (energy per area), or other parameter.

Figure 10:
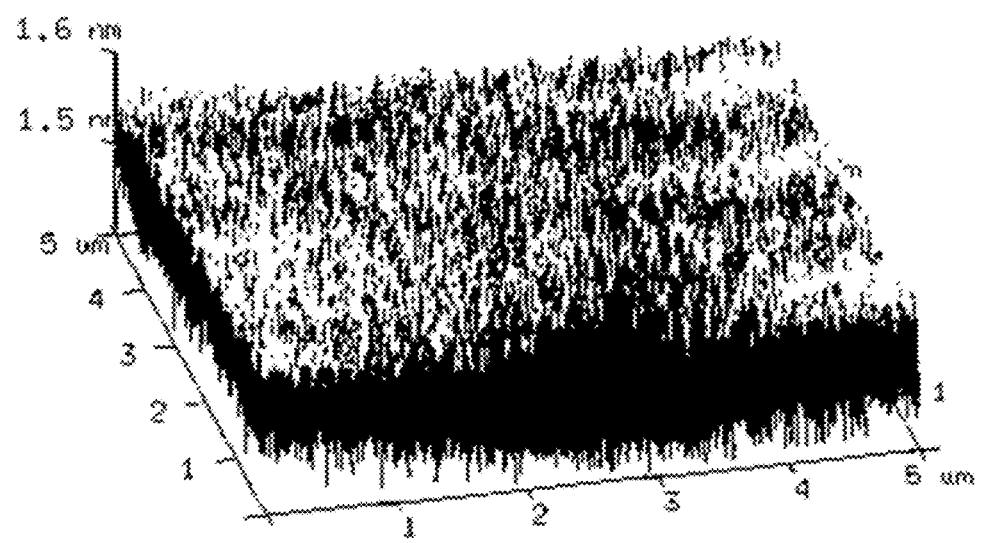
FIG. 10 shows an AFM scan of the composite film of $PMMA:NaYF_4:Er^{3+}, Yb^{3+}$.
Figure 11:
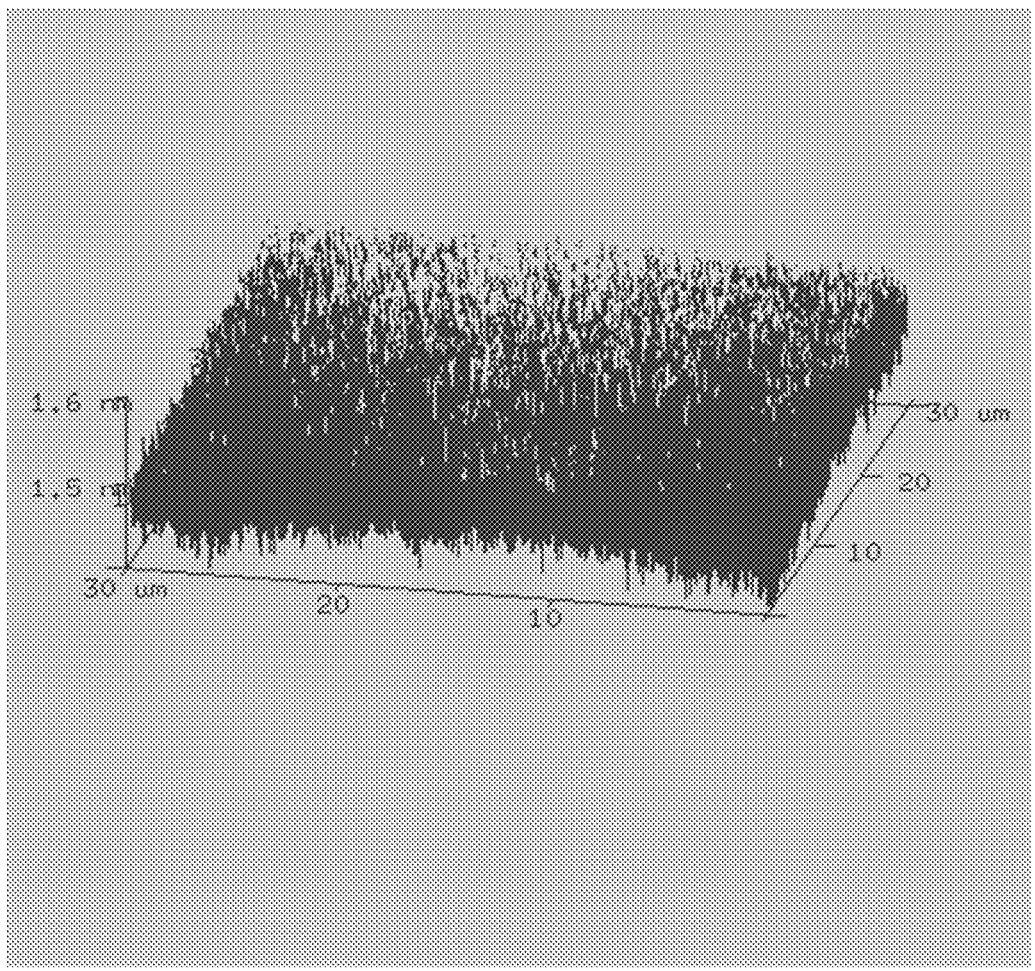
FIG. 11 shows an AFM scan of the composite film of $PMMA:NaYF_4:Tm^{3+}, Yb^{3+}$.

The exemplary materials of FIG. 10 and FIG. 11 were produced using a first pulse interval comprising simultaneous pulses from two lasers, a 10 ns pulsed green laser and a 10 ns pulsed infra-red laser, followed by 19 pulses from the infra-red laser alone.

During the first pulse interval, the 10-ns-long green pulse is shot, simultaneously with the ~10-ns-long infra-red pulse. As a result, the polymer host and the inorganic dopant were deposited simultaneously (i.e., concurrently) in the layer associated with the two pulses and mixed in the film. Then the green pulse was blocked by a shutter and 19 subsequent infra-red pulses impinge on the frozen polymer target. Only the polymer material was deposited as a result of the 19 pulses. Then again the green and the $21^{st}$ infrared pulse were shot simultaneously, as the sequence is repeated. The sequence may be repeated as many times as desired.

The true mixing of both materials occurs only when the green and infra-red pulses impinge the targets simultaneously. The result was still a slightly stratified film (one true composite layer per 19 purely polymer layers). Regarding the proportion, the proportion may be characterized as "19 layers of pure polymer per one layer of polymer mixed with the inorganic material". Alternatively, a uniform composite film may be produced by keeping the green and infra-red pulses with the same pulse repetition frequency and fully overlapping in time and to control the proportion by varying the fluence (pulse energy per unit of the target area) of the pulses. The fluence of the laser pulses can be controlled either using in-line laser beam attenuators (such as a pair of high-power rotating Glan-Thompson polarizers) or tighter focusing/defocusing the beams. After reaching the threshold fluence of ~1 J/cm$^2$ (for the most of the target materials), further increase of the fluence usually leads to the proportional increase of the rate of the deposition of the target material on the substrate. For instance, if the fluence of the infra-red beam would be 20 J/cm$^2$ (tightly focused beam), and the fluence of the infra-red beam would be 1 J/cm$^2$, the truly uniform composite film with 1 portion of the inorganic material per 20 portions of the polymer (or about 5% proportion). In order to convert this proportion in more meaningful mass (weight) or molar proportion, the calibration experiments must be performed relating the laser pulse fluence to the amount of each material being deposited on the substrate.

The proportions of PMMA and inorganic may be varied over a wide range as needed for the application. Less inorganic will produce less intense visible light when illuminated by the same IR excitation. Greater inorganic will increase the visible response to the IR excitation up to the region where the film becomes opaque due to the inorganic content. At some point, the film adhesion and durability may be affected by an overload of inorganic content.

Significant advantages arise from the dual beam configuration even though the pulses may not be sufficiently simultaneous for the respective plumes to interact for each pulse deposition. First, the pulse rate is not limited by having to exchange targets mechanically to utilize a single beam. Second, targets may be more constrained in position permitting larger and more complex target holders with features such as cooling and temperature regulation.

Surface Morphology of the Composite Films Produced with DPLD

The surface roughness and the homogeneity of the deposited polymer nanocomposite films was evaluated using a Bruker Atomic Force Microscope as shown in FIGS. 10 and 11. The AFM scans indicate that the DPLD thin films came out smooth without major defects. This might be a benefit attributed to the optimal interaction between the two plumes. Substrate heating resulted in more uniform film. The roughness of the surface was measured to be near 1-2 nm rms, less than 5 nm rms for the films of 190-270 nm thickness. Although an accurate count of pulses was not recorded, it is estimated that approximately 400 infra-red pulses were used to produce the films of FIGS. 10 and 11.

Thus the DPLD process is capable of producing thin films from a few nanometers to 200 nanometers or 1000 nanometers and more, while maintaining high surface uniformity and precise mixture control on a layer by layer (pulse by pulse) basis.

XRD Analysis

The DPLD produced polymer composite films were analyzed using X-ray diffraction (XRD) method. For comparison, the positions of the X-ray diffraction peaks of the composite film of PMMA:NaYF$_4$:Ho$^{3+}$,Yb$^{3+}$ are marked in the XRD spectrum of the initial powder material (FIG. 8) with black downward arrows. The composite film contains mainly the hexagonal product Na$_{1.5}$Y$_{1.5}$F$_6$ and has much less (no noticeable traces) of cubic NaYF$_4$ as compared to the initial upconversion powder material. The particles of the disordered Na$_{1.5}$Y$_{1.5}$F$_6$ product embedded in the polymer matrix are highly crystalline.

The positions of the X-ray diffraction peaks of the composite film of PMMA:NaYF$_4$:Tm$^{3+}$,Yb$^{3+}$ are also marked in the XRD spectrum of the initial powder material (FIG. 9) with black downward arrows. The polymer composite film again contains mainly the hexagonal product Na$_{1.5}$Y$_{1.5}$F$_6$ and has much less (no noticeable traces) of cubic NaYF$_4$ as compared to the initial upconversion powder material. The particles of the disordered hexagonal phase Na$_{1.5}$Y$_{1.5}$F$_6$ embedded in the polymer matrix are highly crystalline. The XRD data thus clearly indicate that the major hexagonal phase Na$_{1.5}$Y$_{1.5}$F$_6$ hosting the RE ions in the initially prepared upconversion phosphors was successfully transferred in the polymer composite films during the DPLD process.

Fluorescence

Figure 12:
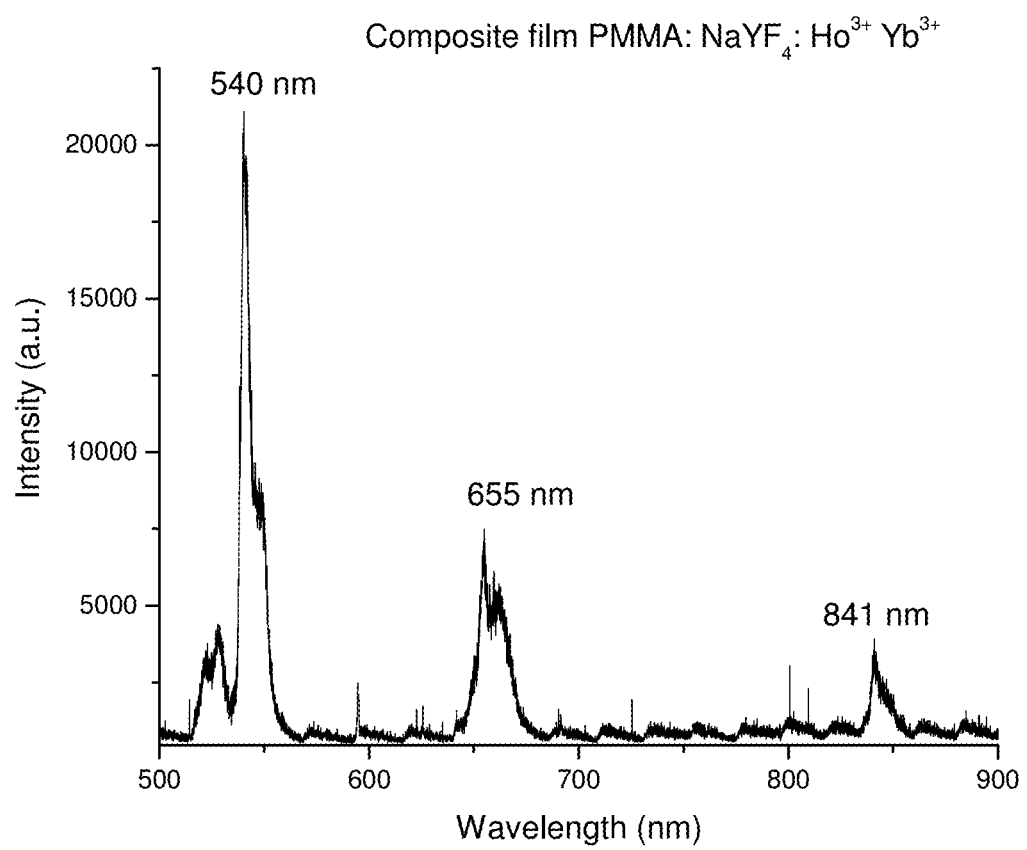
FIG. 12 shows a fluorescence spectrum of composite film $PMMA:NaYF_4:Er^{3+}, Yb^{3+}$ illuminated with 980-nm laser radiation.

The prepared composite films were illuminated with a 200-mW laser diode (from Sky Laser) at 980-nm. Upconversion fluorescence in green or blue region was observed by the naked eye at room light. The observation results are summarized in Table 1. The exemplary fluorescence spectrum of the composite film of PMMA:NaYF$_4$:Ho$^{3+}$, Yb$^{3+}$ pumped with a 980-nm laser source is presented in FIG. 12. The spectrum was taken using similar procedure as for the upconvesrion powder samples. Comparison against the upconversion fluorescence spectrum of the powder of $NaYF_4:Ho^{3+}, Yb^{3+}$ (FIG. 6) indicates that the spectrum of the composite film retains the same structure of the peaks. However, the peak at 751 nm significantly weakens and the peak at 841 nm becomes more prominent in the composite film sample. The green emission peak at 540 nm in both, powder and composite film samples, remains dominant. The intensity of the 540-nm green emission from the composite film was measured to be approximately 0.1% of the pump power (980-nm) reflected from the film (oriented at 45° to the incident beam) in the monochromator. The results presented in Table 1 and FIG. 12 together with the XRD data indicate that the proposed DPLD method made possible to transfer the RE compounds in the polymer composite films preserving their structure and the upconversion fluorescence properties fully (row 1 in Table 1) or partially (rows 2 and 3 in Table 1).

TABLE 1

Comparison of the observed emission from the composite films prepared by the DPLD method against the emission produced by the initial RE powders

| N | Composite film | Observed emission from the film | Initial RE-doped compound | Observed emission from the powders |
|---|---|---|---|---|
| 1 | $PMMA:NaYF_4:Er^{3+}, Yb^{3+}$ | Bright green | $NaYF_4:Er^{3+}, Yb^{3+}$ | Bright green |
| 2 | $PMMA:NaYF_4:Ho^{3+}, Yb^{3+}$ | Weak green | $NaYF_4:Ho^{3+}, Yb^{3+}$ | Bright green |
| 3 | $PMMA:NaYF_4:Tm^{3+}, Yb^{3+}$ | Weak blue | $NaYF_4:Tm^{3+}, Yb^{3+}$ | Blue |

Three Beam Deposition

In accordance with a further variation, three laser beams may be directed to three separate targets for simultaneous, near simultaneous and/or alternating deposition on the substrate. The three beams allow simultaneous deposition of three different substances requiring different target composition or requiring different wavelength or power laser for proper deposition. Providing a separate laser and target for one substance also allows varying the concentration without having to reformulate the target and allows varying the concentration during deposition.

Figure 13:
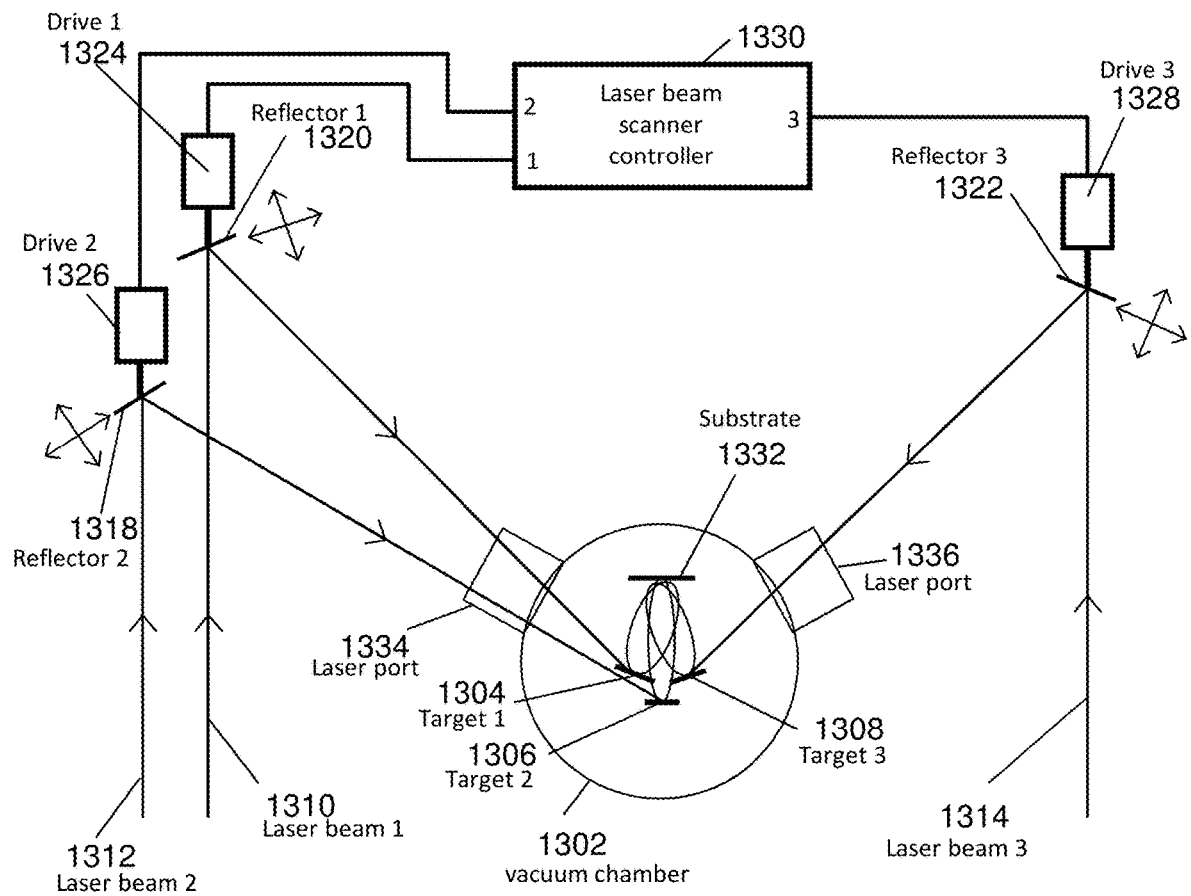
FIG. 13 illustrates an exemplary system comprising three laser beams are directed to three respective targets.

FIG. 13 illustrates an exemplary system comprising three laser beams 1310, 1312, 1314 directed to three respective targets 1304, 1306, 1308. As shown in FIG. 13, each laser beam is reflected from a respective scanning mirror 1320, 1318, 1322. Each scanning mirror is a two axis scanning mirror for scanning the beam in two axes across the target to more fully utilize target material and avoid making pits/craters in the target that may misdirect the plume and result in premature target cracking. Alternatively (see FIG. 3), the target may be mounted on a movable mount to scan the position of the target to move the target relative to a fixed laser beam. The scanning mirrors are each coupled to a respective drive 1324, 1326, 1328, which is connected to a controller 1330. Also shown is vacuum chamber 1302 with laser ports 1334 and 1336, and also shown is the substrate 1332.

Pulsed Optical Parametric Oscillator

In a further variation, one or more of the optical sources, for example beam 3, may be a pulsed optical parametric oscillator source (OPO). The OPO is typically a laser pumped resonant cavity containing a nonlinear optical element (crystal). The OPO converts an input laser wave (called "pump") with frequency $\omega_p$ into two output waves of lower frequency by means of the second-order nonlinear optical interaction. The two output waves are called "signal" with frequency $\omega_s$ and "idler" with frequency $\omega_i$, where signal is the output wave with higher frequency $\omega_s > \omega_i$. The sum of the output waves' frequencies is equal to the pump wave frequency $\omega_p = \omega_s + \omega_i$. An advantage of the OPO is that the output wave is tunable, and the range may be configured to cover the one to three micron range, where polymer and solvent resonances are typically found. Typical chemical bonds and their vibrational modes that can be utilized are O—H stretch (vibrational mode wavelength 2.90 µm), C—H stretch (vibrational modes 3.28, 3.30, 3.38, 3.40, 3.42, and 3.45 µm), and C—O stretch (8.96 µm). Thus the system may be operated in RIR or RIR-MAPLE operating modes. A particular resonance of the target material may be selected. The excitation may be preferentially directed to the polymer (RIR mode) or to the solvent (RIR-MAPLE), if each has a separate absorption band, or may alternate between polymer and solvent (combined RIR/RIR-MAPLE mode) to find the conditions that yield the best quality deposition.

In one particular embodiment the OPO is versaScan-ULD from GWU-Lasertechnik (Erftstadt, Germany) with nonlinear crystal $\beta$-$BaB_2O_4$ (BBO) and the tuning ranges 400 to 709 nm for signal and 710 to 3500 nm (2857 $cm^{-1}$) for idler. It is pumped with the third harmonic (355 nm) of the Q-switched Nd:YAG pulsed laser Quanta-Ray Lab-170-10 from Spectra Physics (division of Newport, Newport, Calif., USA). The pulse width of the pump laser beam is 2-3 ns, pulse repetition rate is 10 Hz, energy per pulse is 220 mJ. With the tuning range for the idler reaching 3.5 µm or 2857 $cm^{-1}$, the OPO can selectively deliver energy to the stretch mode O—H (2.9 µm) and C—H stretch modes (3.28, 3.30 µm).

Figure 14:
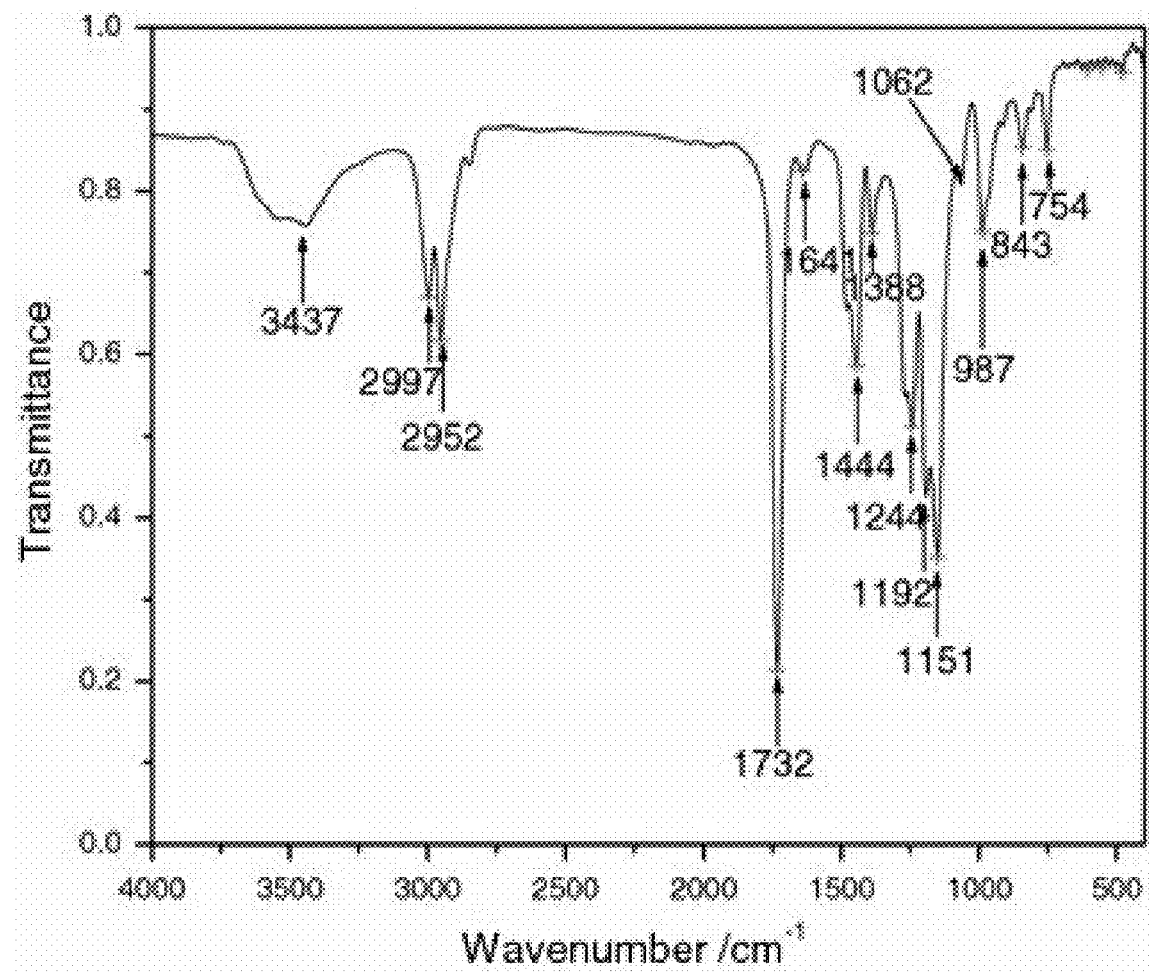
FIG. 14 shows the FT-IR spectrum of PMMA.

FIG. 14 shows the FT-IR spectrum of the PMMA (Duan G, Zhang C, Li A, Yang X, Lu L, Wang X, Preparation and Characterization of Mesoporous Zirconia Made by Using a Poly (methyl methacrylate) Template, Nanoscale Res Lett (2008)). It can be seen that there is a distinct absorption band from 1150 $cm^{-1}$ to 1250 $cm^{-1}$, which can be attributed to the C—O—C stretching vibration. The two bands at 1388 $cm^{-1}$ and 754 $cm^{-1}$ can be attributed to the $\alpha$-methyl group vibrations. The band at 987 $cm^{-1}$ is the characteristic absorption vibration of PMMA, together with the bands at 1062 $cm^{-1}$ and 843 $cm^{-1}$. The band at 1732 $cm^{-1}$ shows the presence of the acrylate carboxyl group. The band at 1444 $cm^{-1}$ can be attributed to the bending vibration of the C—H bonds of the —$CH_3$ group. The two bands at 2997 $cm^{-1}$ and 2952 $cm^{-1}$ can be assigned to the C—H bond stretching vibrations of the —$CH_3$ and —$CH_2$— groups, respectively. Furthermore, there are two weak absorption bands at 3437 $cm^{-1}$ and 1641 $cm^{-1}$, which can be attributed to the —OH group stretching and bending vibrations, respectively, of physisorbed moisture. The tunable OPO can resonantly excite the C—H bond absorption bands at 2997 $cm^{-1}$ and 2952 $cm^{-1}$ and the —OH band at 3437 $cm^{-1}$ and deliver energy to the PMMA molecules to heat them up and evaporate thus implementing the RIR deposition method.

Figure 15:
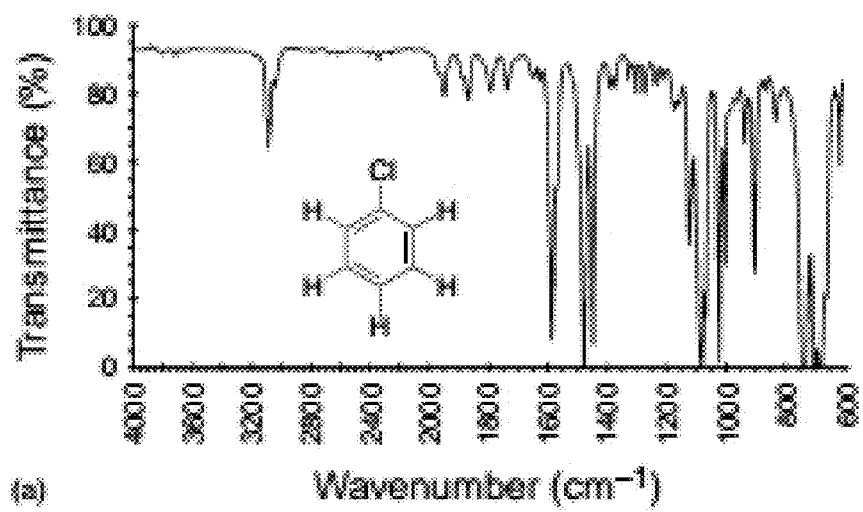
FIG. 15 and FIG. 16 show the infra-red absorption spectra of chlorobenzene (FIG. 15) and toluene, respectively.
Figure 16:
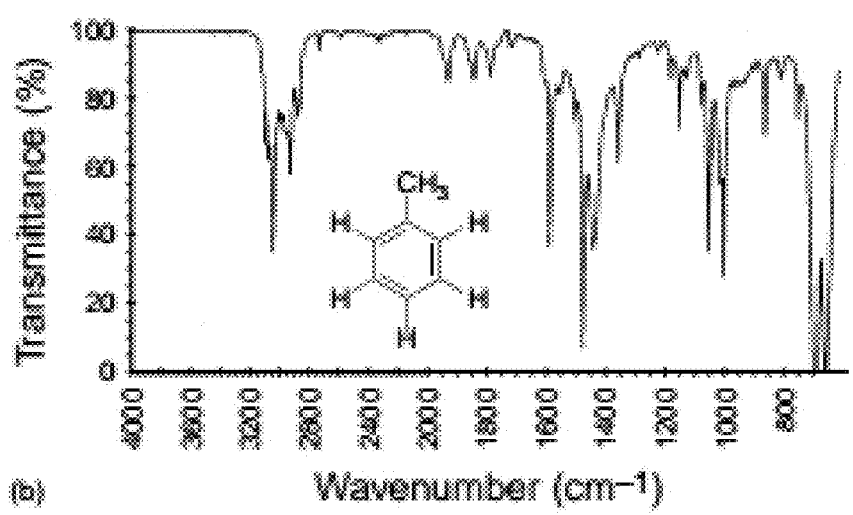

FIG. 15 and FIG. 16 show the infra-red absorption spectra of chlorobenzene (FIG. 15) and toluene (FIG. 16) that are used do dissolve PMMA and prepare frozen (with liquid nitrogen) targets for the MAPLE. The tunable OPO can be used to resonantly excite vibrational bands between 3200 and 2900 $cm^{-1}$ thus implementing the MAPLE method.

The variable wavelength also allows greater freedom of choice of polymer and/or solvent. A fixed wavelength source would require selecting a polymer or solvent having an absorption band compatible with the fixed source.

Multiple Beam Deposition with Optical Feedback

Figure 17:
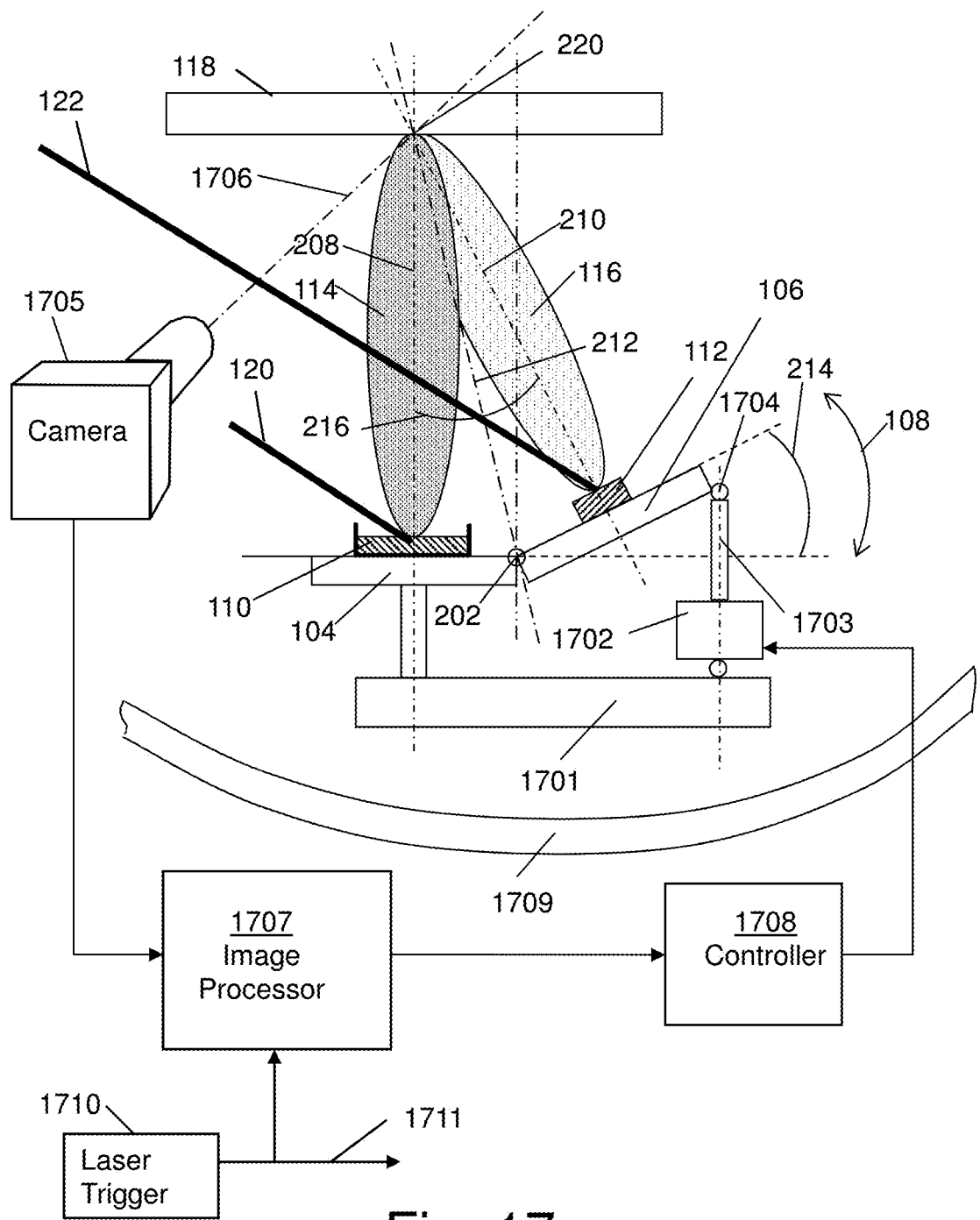
FIG. 17 presents an exemplary variation of the optical feedback for control of the position of the plumes from multiple targets (two, as an example) during the PLD process.

FIG. 17 presents exemplary variation of optical feedback for control the position of the plumes from multiple targets (two, as an example) during the PLD process. The feedback loop comprises base 1701, linear actuator 1702, link 1703 connecting the actuator to tilting target holder 106, hinge 1704, digital video camera 1705 with line of sight 1706, computer 1707; controller of the linear actuator 1708 connected to the linear actuator with an electrical cable connected through a vacuum feedthrough mounted on the wall of vacuum chamber 1709. Linear actuator 1702 is mounted on base 1701 holding stationary target holder 104. The actuator is mechanically connected to tilting target holder 106 with link 1703 that is joined to the holder with hinge 1704. Digital camera 1705 is mounted outside of the PLD vacuum chamber (not shown) on one of the flanges with optical windows in such a way that its line of sight 1706 passes through near the location of substrate 118 where plumes 114 and 116 from respective targets 110 and 112 must overlap. The digital camera is connected to computer 1707. Alternatively, or in addition, the camera may be directed to observe the target and plume origination. In case of semi- or automatic control of the plume overlapping, the computer is connected to controller 1708. During the PLD process, video camera 1705 captures the image of the plumes and sends it to computer 1707. The computer displays the image. In case of manual control, operator manually adjusts the position of tilting target holder 106 with linear actuator 1702 in order to maintain plumes 114 and 116 overlapping on substrate 118 thus making sure the consistency of the proportion of mixing the target materials from targets 110 and 112 in the deposited composite film. In semi-automatic mode, software in the computer analyzes overlapping of the plumes and sends the warning message to the operator when the plumes do not overlap. Upon receiving the message, the operator manually corrects the problem. In automatic mode, the computer software analyzes the image of the plumes to establish if they do not overlap and sends the signal to the linear actuator controller to tilt target holder 106 until the plume overlapping is reached.

In one particular embodiment digital video camera 1705 is high-speed digital camera Memrecam HX-3 from NAC Image Technology (Simi Valley, Calif. 93065 USA). It is attached to one of the 4-inch quartz windows of the PLD vacuum chamber a high-speed video (at a rate of one million to one million and half frames per second (fps)) of the onset of the plums from the targets in the PLD process. HX-3 is a diverse multipurpose camera. It is a 5 Mega Pixel High Speed Camera. It has full resolution of 2560×1920 at 2,000 fps. It comes with accessories including an MPX-Portable Laptop with the GPU Control Console for ultra fast video processing. The recorded high-speed videos of the plume formation are used to optimize the plum formation process, measure the speed of the plume propagation and interaction with the other plums form multiple targets simultaneously exposed to multiple laser beams. The camera also provides images of the plumes to implement the feedback loop for the control of plume overlapping.

Automatic Control of Plume Direction

Referring to FIG. 17, the laser trigger module 1710 sends a trigger signal 1711 to fire the laser. This signal is also sent to the image processing module 1707 to begin recording image frames from a camera 1705. The image processing process includes a frame selection process to select a frame for further processing. Alternatively several frames may be selected and averaged together. The frame selection may be, for example, a predetermined frame number (or delay) after the laser trigger signal, e.g., frame number 10 after the trigger signal. The particular frame selected may be determined from calibration runs. During the calibration process, the operator may review a frame sequence encompassing a desired range of frame numbers and may select a frame number yielding a consistently formed plume to be utilized for subsequent automatic processing by the computer 1707.

In one alternative directed to a more economical system, a single frame may be produced after a predetermined delay from the laser pulse. Further, the single frame may be from a slower camera that integrates light over a larger portion of the plume cycle. The single frame system may be adequate for selected depositions.

For either system, the selected frame is then processed 1707 to yield a gray scale image. If the image is a color image, the color pixels may be summed to yield an intensity image (gray scale). The gray scale image may then be thresholded to yield a boundary (outline) at a predetermined intensity level. The outline may identify regions with high intensity inside and lower intensity outside the threshold boundary. The boundary may then be processed 1707 to yield a major axis for the plume. For example, a centroid may be found for the area within the boundary. A second moment may then be found for a range of prospective axes through the centroid. The axis having the greatest second moment may be designated as the axis of the plume. In one embodiment, the area within the boundary may be evenly weighted for determination of centroid and second moment. Alternatively the intensity level at each pixel may be used for determination of the centroid and second moment.

The sequence of plume axis directions for a sequence of successive pulses may be filtered to reduce noise, and the resulting filtered plume direction information may be compared with a desired axis direction to yield a plume direction error signal The error signal may then be fed to a controller 1708 and servo 1703 to adjust the tilt of the target to correct the direction of the plume.

In one alternative embodiment, the plume axis direction may be determined by thresholding to determine a plume outline. The plume outline may then be processed to determine a centroid. The plume outline man then be processed to find a maximum distance from the centroid on the outline. The plume axis may then be drawn from the centroid through the point of maximum distance. The plume axis may then be compared with a desired axis direction to generate a feedback tilt command for the holder. Optionally, a filter may be employed to reduce noise from pulse to pulse.

In a further alternative embodiment, the plume outline may be compared with an ellipse to find the closest matching ellipse and then the ellipse axis may be used as the plume axis to be compared with the desired axis direction. To find the closest ellipse, a prospective ellipse may be constructed over the plume outline and the area between the plume outline and the prospective ellipse may be determined. The initial position may be with the center of the ellipse positioned at the centroid of the plume outline. The prospective ellipse may then be varied in angle and the area recomputed. When a minimum is found, the ellipse may then be varied in length to find the minimum, then varied in width for a better minimum. The process may be repeated for a further improved minimum. Newton's method or other methods may be used to improve iteration. Once a satisfactory minimum is achieved, e.g., achieving a predetermined small increment between iterations or achieving a predetermined number of iterations, the ellipse axis may be used as a measure of the plume axis.

In a further alternative, the plume axis may be determined by a line from the center of laser illumination on the target through the centroid or other feature of the plume threshold outline.

Once a plume axis is determined, the plume axis direction may be compared with a predetermined desired axis direction to produce an axis direction error signal for input to a controller to adjust the tilt of the target holder. The axis direction error signal may optionally be filtered to reduce noise. One exemplary method of filtering may be to command only small increments for each pulse, for example, one tenth of the error magnitude, or one step of a stepping motor control.

As shown, a single axis of tilt control is implemented. Alternatively, a second camera may be installed for an orthogonal view and a two orthogonal axis tilt control may be implemented based on the two camera observations.

In addition to providing real time feedback control of the plume direction, the camera may be used to observe the kinetics of the plume: onset, evolution, and propagation towards the substrate. The plume development may take, for example, 100 microseconds. Thus, a camera with a million frame per second capability may take 100 frames during the plume development. The images may be used by the operator to adjust the process in real time and may be stored for later analysis.

The images may also be valuable in the observation of the interaction of plumes at the plasma level at microsecond time frames, including substitutional lattice combination and/or thermal fusion of the plumes. The high speed camera is expected to reveal physical combinations of polymeric material.

Figure 18:
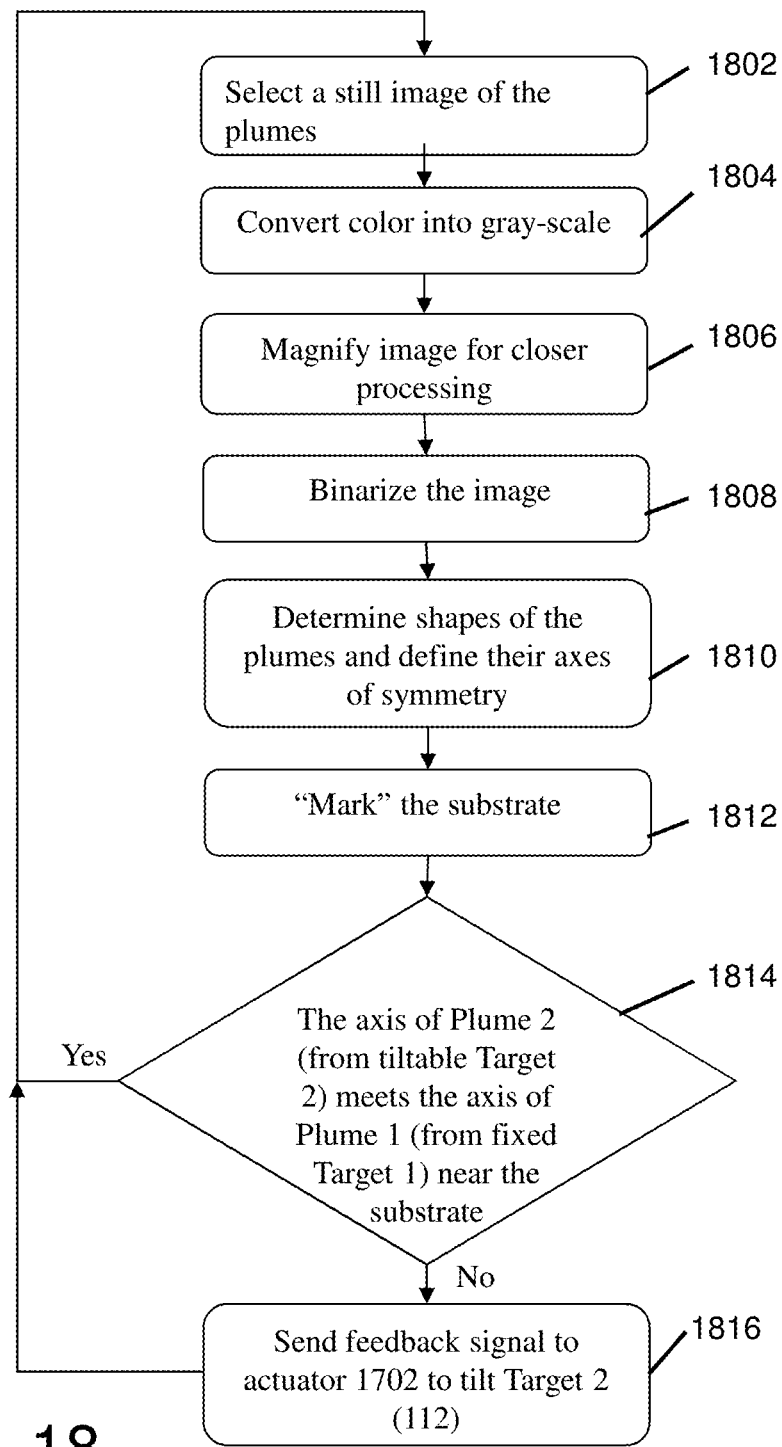
FIG. 18 depicts an exemplary method for feedback control of the target tilt angle.

FIG. 18 depicts an exemplary method for feedback control of the target tilt angle. Referring to FIG. 18, the process starts by selecting a still image of the plume or plumes 1802. The image may be one of many, or a single image delayed from a laser pulse. If the image is in color, the color may be converted to gray scale 1804, for example, by selecting or summing one or more color signals. Camera scale or linearity corrections may also be made. A portion of the image may then be selected for detail processing to reduce processing time 1806.

The image may then be binarized 1808, i.e., the brightest portion of the plume may be identified by thresholding the intensity values. Pixels greater than a predetermined threshold may be set to "1" and those less than the threshold may be set to "0". The image may be further binarized to define an outline by setting the "1" pixels with a "0" neighbor to "1" and the remaining pixels to "0".

The next step is to process the plume image to determine the principle axis as previously described 1810.

The desired point of intersection of the axis on the substrate is then identified 1812. If the plume axis meets the desired location, the process repeats with another laser pulse 1814. If not, the feedback is adjusted to tilt the target to correct the axis deviation 1816.

Figure 19:
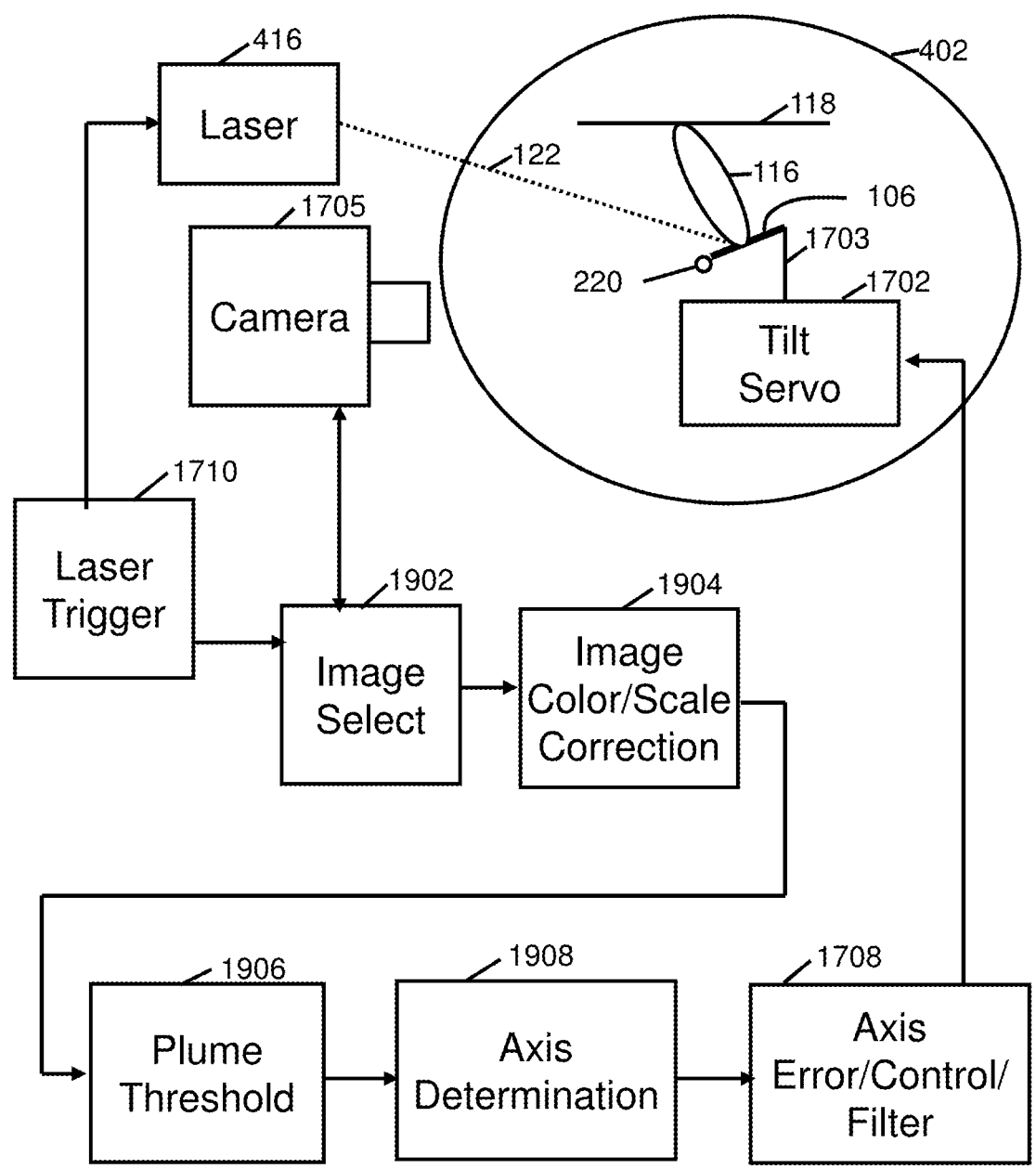
FIG. 19 shows the exemplary plume axis control of FIG. 17 showing additional detail of the feedback process.

FIG. 19 shows the exemplary plume axis control of FIG. 17 showing additional detail of the feedback process. Referring to FIG. 19, the laser trigger initiates a laser pulse. A camera 1705 is directed to view a desired portion of the plume. The laser timing is also provided to the camera 1705 and image select module 1902 to synchronize camera timing to the laser pulse 122 and obtain an image after desired development of the plume 116, for example, the tenth frame of a sequence, or a frame ten microseconds after the pulse.

The selected image is then processed for color or scale correction 1904 to produce a gray scale (intensity) image. The gray scale image is then processed 1906 to obtain plume direction information. Plume direction may be derived from plume shape or position. Plume shape may be determined by thresholding 1906 the intensity information and applying one of the methods previously described with respect to FIG. 17. Plume position may also be determined by thresholding and determining the centroid or other feature relative to the laser spot on the target (See FIG. 17).

A measured plume axis may then be determined 1908 as the longest length of the determined shape; or may be determined as the position of a plume feature (for example, centroid or peak) relative to the plume origin at the laser spot on the target.

A desired axis direction is predetermined based on desired deposition, for example the center of the substrate. The measured plume axis direction may then be compared with the desired plume axis direction to generate a plume axis direction error signal 1708. The error signal may then be filtered, if necessary, to reduce noise 1708. The filtered error signal may then be used to develop a control signal 1708 that is fed to the tilt servo 1702 and linkage 1703 to adjust the target platform 106 angle and thus adjust the plume angle.

Figure 20:
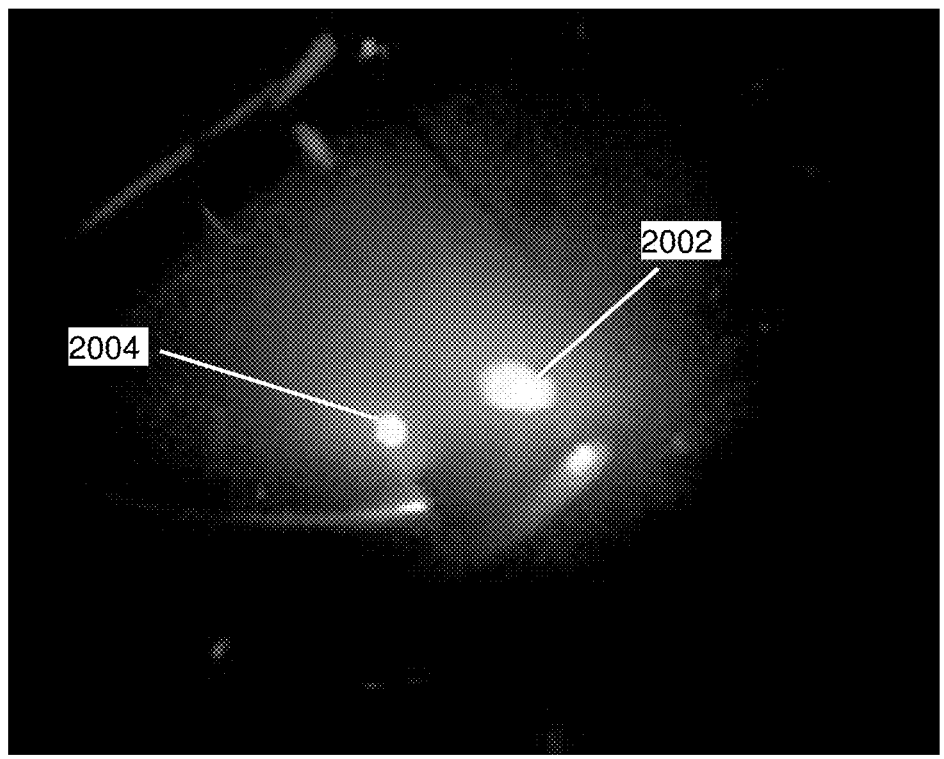
FIG. 20 shows a gray scale image showing two plumes.

FIG. 20 shows a gray scale image showing two plumes. The camera may be directed to observe one or more plumes. The image shows a first plume 2004 and a second plume 2002. The image may then be cropped to reduce processing time.

Figure 21:
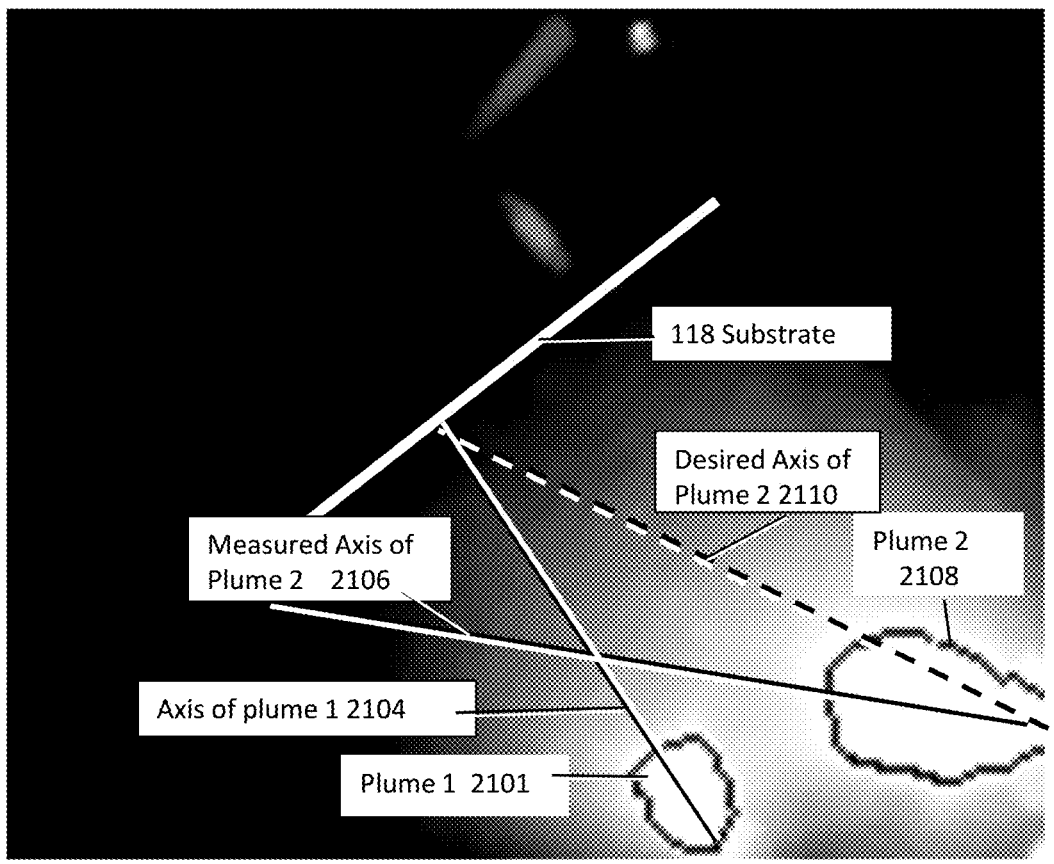
FIG. 21 shows a cropped portion of image FIG. 20.

FIG. 21 shows a cropped portion of image FIG. 20. Note that axes and lead lines are drawn with parallel white and black lines for visibility through the high contrast background. FIG. 21 shows the two plumes 2101 and 2108. The substrate position is drawn as a white line. The result of thresholding and finding the outline of the threshold boundary is shown as the black outlines 2101 and 2108 A respective plume axis is shown at 2104 and 2106. A desired plume axis for the second plume is shown as broken line 2110. An error signal may be based the angle from axis 2106 to 2110. The error signal may then drive the target platform to move in the direction to rotate plume axis 2106 toward axis 2110.

Multiple Beam Deposition with Multiple Switchable Targets

Figure 22:
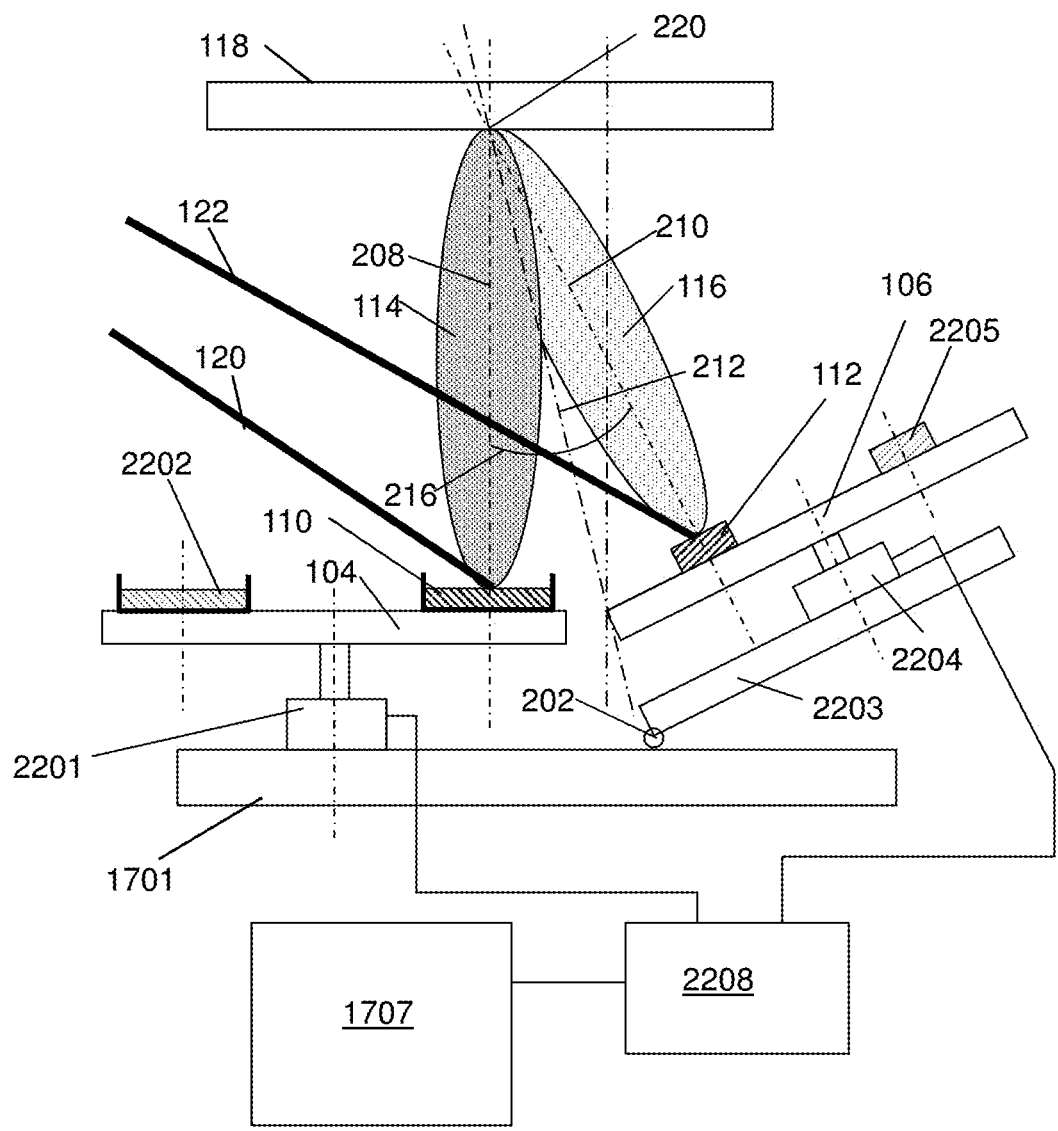
FIG. 22 presents an exemplary configuration of the multiple beam deposition system with multiple switchable targets mounted on rotary holders.

FIG. 22 presents an exemplary configuration of the multiple beam deposition system with multiple switchable targets mounted on rotary holders. The exemplary embodiment has two rotary holders with eight targets each. The system includes stepper motor 2201 of rotary target holder 104, which does not tilt, and the system also includes stepping motor 2204 mounted on the tiltable holder 106 and member 2203. The two holders are controlled by controller 2208 driven by processor 1707.

Figure 23:
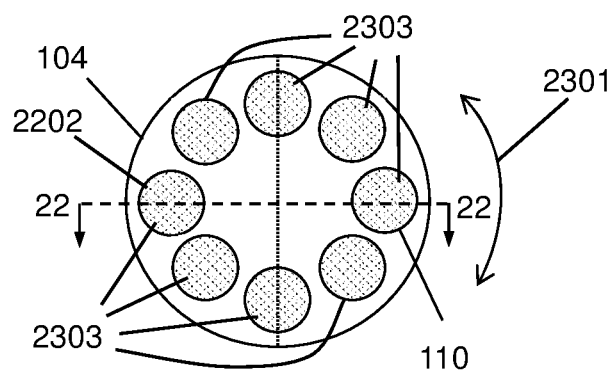
FIG. 23 and FIG. 24 depict a top view of the rotary targets of FIG. 22.
Figure 24:
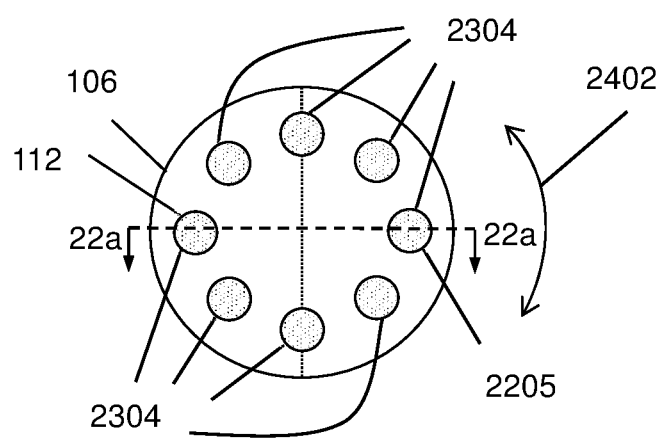

FIG. 23 and FIG. 24 depict a top view of the rotary targets of FIG. 22. FIG. 23 shows the eight targets 2303 of holder 104 (including targets 2202 and 110 shown in FIG. 22. Cut section 22 refers to the view of holder 104 in FIG. 22.) and indicates the possible rotation 2301 of holder 104. FIG. 24 shows the eight targets 2304 of holder 106 (including targets 112 and 2205 shown in FIG. 22. Cut section 22a refers to the view of holder 106 in FIG. 22.) and indicates possible rotation direction 2402 for holder 106. Eight targets each are shown, but any number of targets may be placed as desired on each holder. The target materials may be the same, or different, as needed for the deposition.

In one particular embodiment, the pulsed laser deposition system has two laser beams with 10 levels of fluence adjustment in order to select different target ablation rates and thus different mixing rates between two simultaneously deposited target materials in the resulting composite film. The "laser off" mode can be considered as the "idle" ablation rate (no target material being deposited). With the turret for each laser beam having 8 targets, the total number of possible variations of the compound mixtures in the resulting composite film is equal to $(10 \times 8+1) \times (10 \times 8+1) = (10 \times 8+1)^2 = 81^2 = 6561$. With three laser beams and three target holder respectively, the number of possible variations would be $81^3 = 531441$ Such arrangement dramatically increases the number of choices in composition of the deposited film and its desired properties.

Multiple Beam Deposition with Substrate Manipulation

Figure 25:
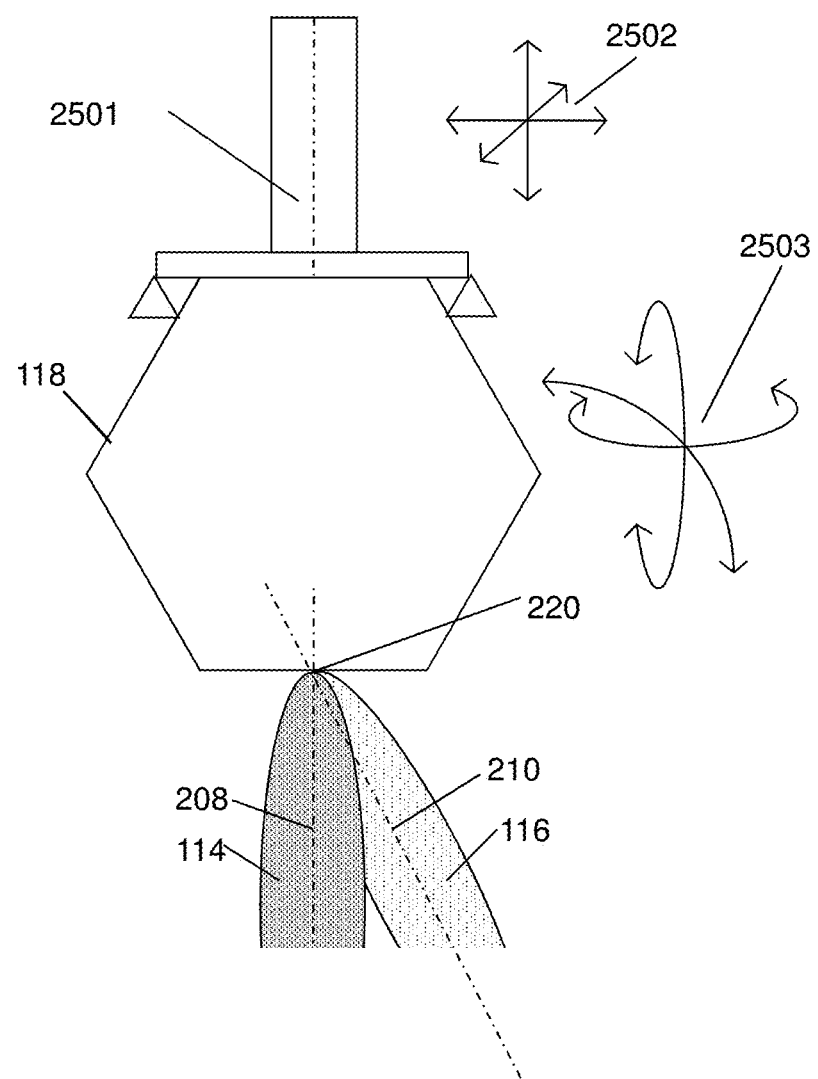
FIG. 25 presents an exemplary schematic of a variation of a six-degree-of-freedom substrate manipulation system.

FIG. 25 presents an exemplary schematic of a variation of a six-degree-of-freedom substrate manipulation system. The exemplary shape of the said substrate is that of a hexagonal prism. The system consists of holder 2501 of substrate 118; the holder driven by a computerized translation/rotation actuator (not shown) moves the said substrate along three translational directions 2502 and three rotational directions 2503. The movements of substrate can be implemented in intermissions between the pulsed laser depositions in order to switch between the faces to be coated. The movements can be also implemented during the positions in order to change the angle of a particular face to be coated with respect to plumes 114 and 116 or to gradually change the thickness of a coating along a particular face. Combining substrate manipulation with target switching makes possible to coat different faces of the substrate with different composite coatings.

In one exemplary embodiment "substrate" 118 can be the steel blade of a knife. The blade is manipulated in such a way that its sharp edge is PLD coated with diamond coating enhancing its cutting capability. Then the blade can be turned to put one of its sides at a time in front of plumes 114 and 116 to deposit a nanocomposite film of polymer Teflon® doped with inorganic pigment nanoparticles to enhance the blade's capability of sliding through a material and improve its esthetic appearance.

Combination of Inorganic PLD and MAPLE

PLD (Pulsed Laser Deposition) and MAPLE (Matrix Assisted Pulsed Laser Evaporation) are very different processes typically run using incompatible operating conditions. PLD is typically run to deposit an inorganic material with a very intense (usually of ultraviolet or visible) laser that produces an ionized gas plasma plume that is self-luminescent. The material gets in the plume and deposits on the substrate. MAPLE typically uses an organic solvent to deposit a fragile organic compound such as polymer. An infrared beam may be desired to evaporate the solution without doing excessive damage to the polymer. The evaporation falls short of producing an ionized plume and does not emit visible radiation.

MAPLE presents a further challenge in that the polymer solution is typically frozen to liquid nitrogen temperatures before loading into the chamber. Handling of the cold target while loading the chamber may attract moisture in the form of frost and condensation, thereby introducing moisture contamination to the chamber and complicating the purging and initial vacuum pull down of the chamber.

MAPLE Target Loading Sequence

Figure 26:
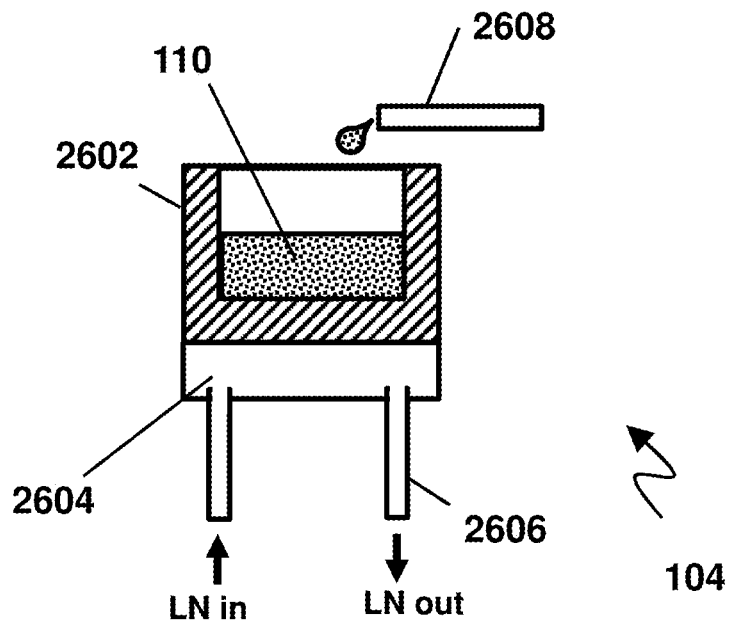
FIG. 26, FIG. 27, and FIG. 28 depict a MAPLE target at successive stages of filling and cooling.
Figure 27:
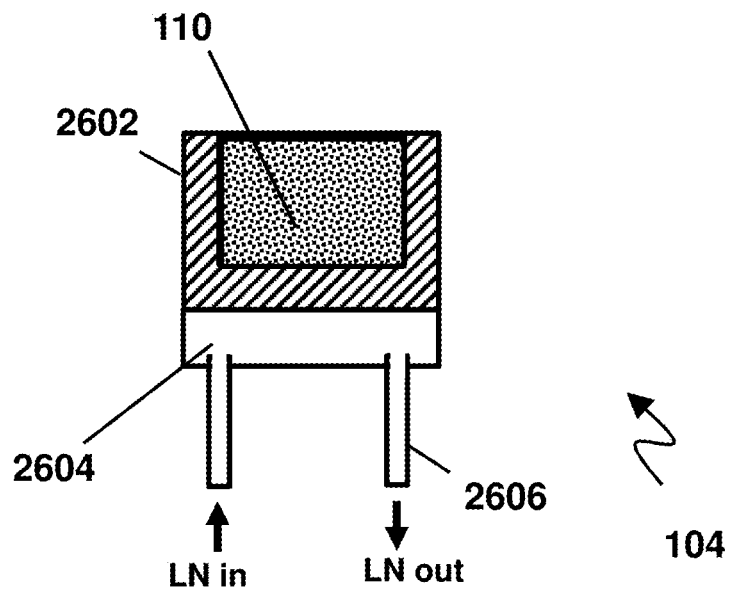
Figure 28:
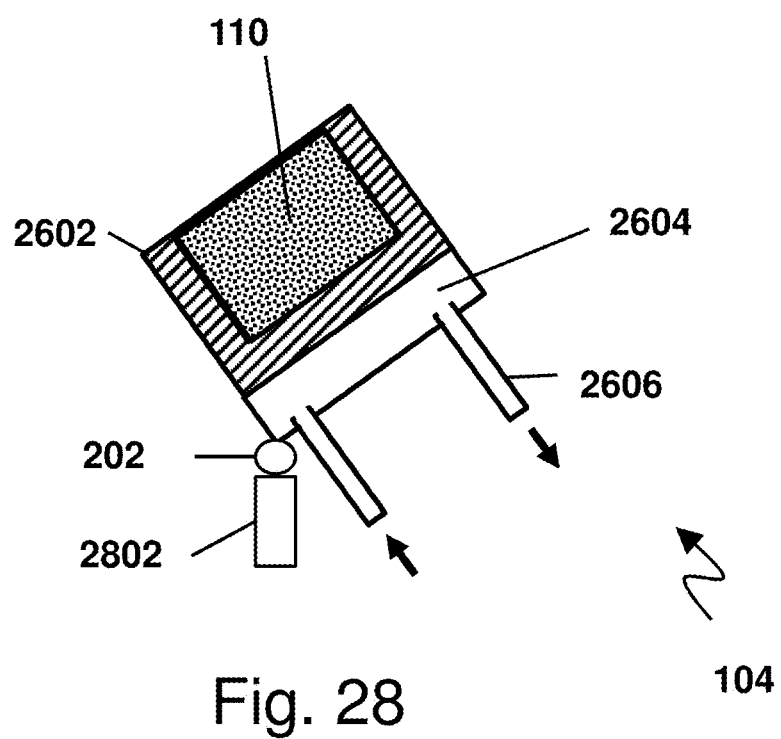

In one embodiment, it may be advantageous to load the MAPLE solution into the vacuum chamber in an initially ambient temperature liquid state to avoid excessive condensation contamination. Ambient room air may be typically 25 to 30 degrees centigrade with 20 to 60 percent humidity. FIG. 26, FIG. 27, and FIG. 28 depict a MAPLE target and holder at successive stages of filling and cooling. FIG. 27, through FIG. 28 depict a target holder as may be used with other figures, for example FIG. 1, FIG. 2 and/or FIG. 3. Referring to FIG. 26, the target holder 104 comprises a cup 2602 and a cooler 2604. The cup 2602 for holding target material 110 is placed in position in the chamber in a horizontal orientation so that the cup 2602 can be filled with liquid through fill tube 2608 without spilling the liquid. The cup is thermally coupled to the cooler 2604 that can be filled or circulated with liquid nitrogen (LN) or other refrigerant supplied through coolant tube 2606. In a first step, the target holder 104 is initially at room temperature. The cup may then be filled with liquid solution, i.e., polymer and solvent, through the filler tube 2608.

FIG. 27 shows a second step, wherein the vacuum chamber may then be closed and ambient air purged with a dry gas, e.g. dry nitrogen, dry air, argon, or other dry gas.

In a third step, after the moisture is removed from the chamber, the cup 2602 may then be cooled by the cooler 2604 by circulating refrigerant through the refrigerant supply tubing 2606 until the polymer solution 110 is solid or cooled to a temperature that can tolerate vacuum. Some liquids may boil or evaporate excessively when prematurely exposed to too much vacuum.

FIG. 28 shows a fourth step. After the polymer solution 110 is frozen solid, the vacuum chamber may then be evacuated and the target assembly 104 may be tilted using hinge 202 to a slanted or vertical operating orientation relative to support 2802.

Alternatively, if the liquid polymer solution tolerates at least some vacuum, the purging step may be eliminated and the chamber may be partially evacuated with the liquid solution in the cup followed by cooling the liquid solution after the chamber achieves a predetermined vacuum tolerated by the liquid, for example, a vacuum of less than 100 torr. After cooling, the vacuum may be continued to a desired full purge vacuum, for example less than 10 milli torr, or less than $10^{-4}$ torr or other end point.

Liquid MAPLE

Figure 29:
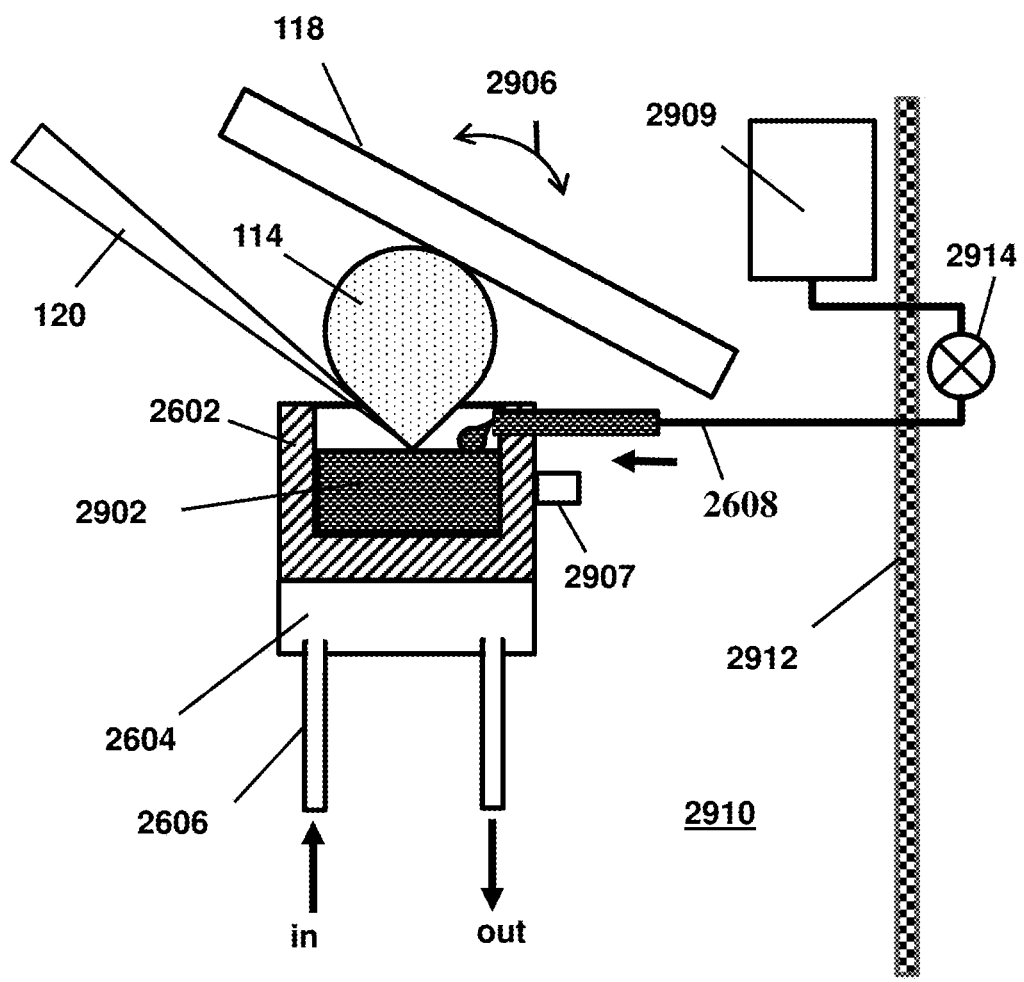
FIG. 29 illustrates an exemplary configuration for operation of a liquid target for MAPLE deposition.

FIG. 29 illustrates an exemplary configuration for operation of a liquid target for MAPLE deposition. The target cup 2602 is oriented horizontally with respect to gravity to allow the liquid target material 2902, i.e., matrix solvent with polymer, to be retained within the cup. The cup 2602 may be cooled with a cooler 2604 to reduce the vapor pressure of the solution, but not so much cooling as to freeze or separate components of the solution. A suitable coolant may be circulated through the coolant tubing 2606.

When the laser beam strikes the surface of the solution, the matrix is energetically evaporated, carrying with it some of the polymer. The polymer continues to the substrate and is deposited on the substrate. The matrix solvent, having a vapor pressure higher than the ambient pressure of the chamber, is eliminated through the vacuum pump system. In one alternative, the substrate may have a substrate heater which heats the substrate sufficiently to prevent condensation of the solvent on the substrate.

In a further alternative, the cup 2602 may include a feed tube 2608 for continuous or periodic refilling of the cup 2602 with liquid solution 2902. The new solution may be added at a predetermined fixed rate or may be added responsive to a level sensor 2907 or other indication of the level of the liquid in the cup. Liquid is shown sourced from a reservoir 2909 located inside the vacuum chamber 2910 and exposed to chamber pressure and regulated by a valve 2914 controlled from outside the chamber wall 2912. Alternatively, the liquid 2902 may be circulated through the cup 2602.

The liquid target may have advantages in that there would be no formation of a crater due to erosion of a spot on the target, and thus, no need to rotate the target or scan the beam to avoid crater problems. Further advantage of the refilling is in replenishing the consumed material and thus preventing from reopening the chamber for target replacement.

Note also in FIG. 29 that the substrate 118 may be tilted to allow better geometry for beam 120 entry and illumination of the target. Further, the substrate 118 may be tilted 2906 or moved laterally 2906 to center the plume 114 on the substrate 118 and optimize mixing with a possible second deposition material (See, for example, FIG. 3).

Figure 30:
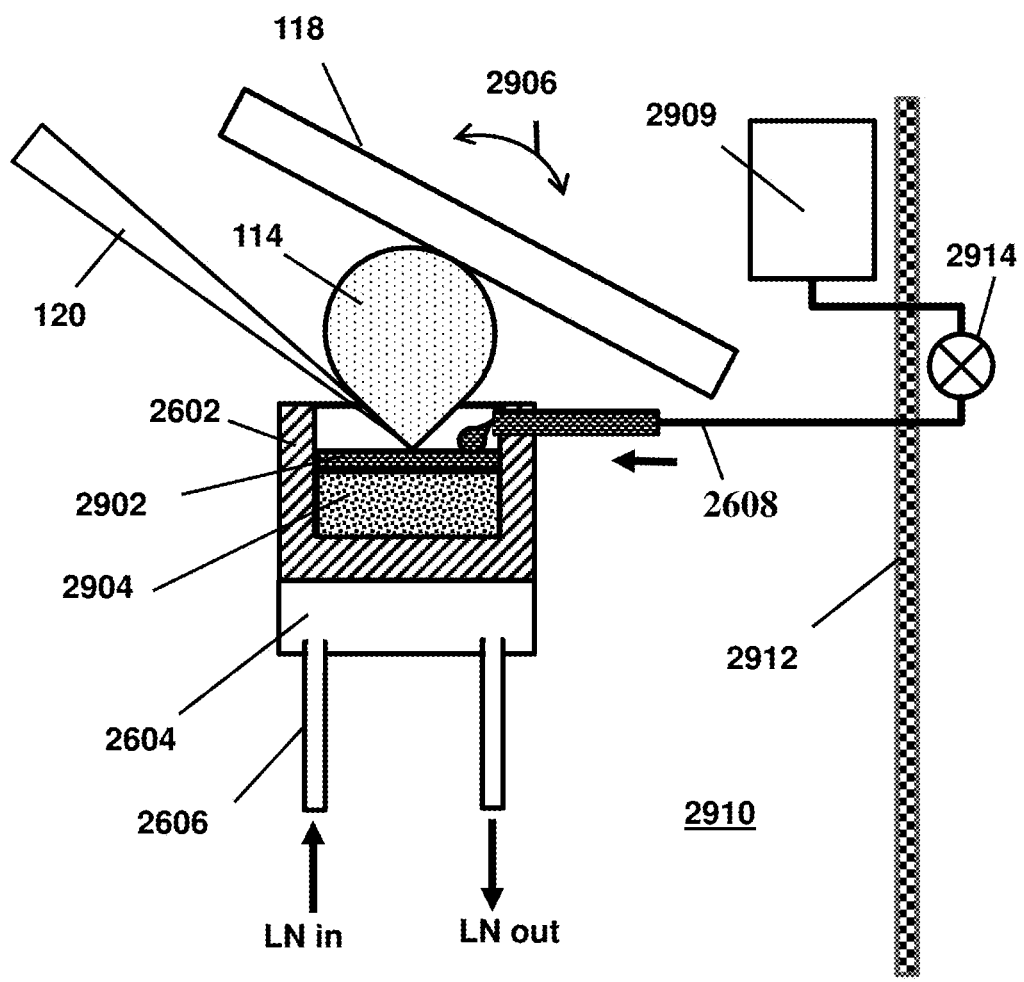
FIG. 30 illustrates using periodic liquid addition to a frozen MAPLE target.

FIG. 30 illustrates using periodic liquid addition to a frozen MAPLE target. FIG. 30 shows liquid solution 2902 and frozen solution 2904. Referring to FIG. 30, the frozen target solution 2904 may develop a crater where repeated laser firings are directed at the same spot that gradually erode the target. Liquid solution 2902 may be applied through the fill tube 2608 to flood the surface of the frozen target 2904, filling the crater and restoring the flat surface of the target. In one variation, the liquid may be added in portions (drops) between laser pulses to let the additions freeze before the next pulse.

Plume Interaction

The PLD plume is composed mostly of the positive ions of the deposited material. The ions of the plume are traveling towards the substrate with an average speed from $10^3$ to $10^4$ m/s (the plume front makes ~1 cm in 100 us on its way to the substrate). The MAPLE plume is composed mostly of the neutral molecules of the polymer and partially of the solvent moving at a speed not exceeding $10^2$ m/s. If the PLD and MAPLE co-deposition takes place at the same time, the fast moving charged PLD plume will collide with the MAPLE plume and can push it from straight direction towards the substrate. That push will not be of the electrostatic (Coulomb force) nature since the MAPLE plume is neutral, but mostly of the mechanical nature (direct inelastic collision). The impact will be thus less pronounced than in case of collision of two plasma PLD plumes. In order to prevent such collision, different timing of the PLD and MAPLE plumes might be selected. For instance, in a typical case of 0.1-second period between the laser pulses, the PLD plume reaches the substrate in 100 us. The MAPLE plume can be initiated by the MAPLE laser pulse with a delay of greater than 100 us after the initiation of the PLD pulse. The MAPLE plume is much slower, but will still be able to reach the substrate in 0.1 s and thus before the arrival of the next PLD laser pulse. In such a way the collision of the co-deposited PLD and MAPLE plumes can be completely prevented, if necessary.

Plume Illumination

In one embodiment, the plume 114 and substrate 118 may be aligned relative to one another for best deposition by feedback from a camera system directed to observation of the plume position and/or direction. For example, the target angle, or the substrate position may be moved to align the plume on the substrate based on plume measurements. A MAPLE plume, however, may be much lower temperature than PLD and not form a plasma as is typical with a PLD plume and thus, the MAPLE plume may have little or no optical emission for observation by the camera. The low emission may be overcome by providing external illumination for observation of the plume.

Figure 31:
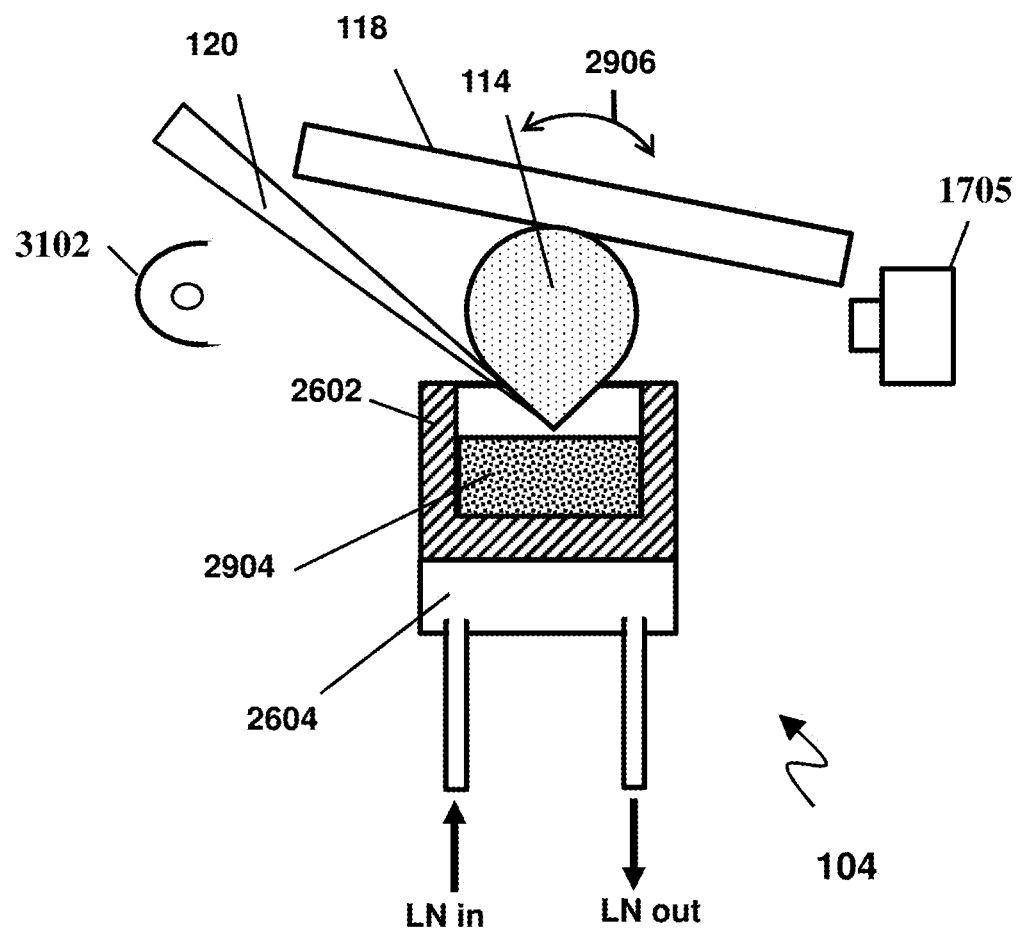
FIG. 31 shows the MAPLE deposition including external illumination and a camera system for producing images of the plume.

FIG. 31 shows the MAPLE deposition including external illumination and a camera system for producing images of the plume. The camera image may then be processed for plume centroid and/or axis direction for feedback to control the target and/or substrate to correct the deposition position. See FIG. 17 for further camera and feedback details. Referring to FIG. 31, the plume 114 is illuminated by a light source 3102. The camera 1705 is directed to view the plume 114 as illuminated by the light source 3102. The light source and camera may be positioned for best observation of the light from the plume while rejecting reflections and direct light from the source. Waveband filters may also be used for optimizing the observation. The camera image may be processed for plume centroid and axis and other parameters and fed back to control target holder 104 direction, and/or substrate 118 position and direction 2906 for best deposition.

In a further variation, the illumination may be ultraviolet or other wavelength that stimulates fluorescence in the plume to produce an optical emission from the plume, as the plume density may be too thin to be effective in scattering the external illumination. A laser source may be used to provide intense illumination at a precise time. In some cases, the polymer being deposited may have a fluorescence that can be utilized. In the absence of a convenient fluorescence in the operating polymer, the polymer solution may be seeded with a fluorescent species at a small percentage, for example less than ten percent, three percent, one percent, by weight, or other tolerable percentage. Exemplary fluorescent species include but are not limited to rhodamine 6G, yellow 5 (tartrazine), and DCM (4-dicyanomethylene-2-methyl-6-(p(dimethylamino)styryl)-4H-pyran). The utilization of fluorescence allows greater attenuation of stray light and reflections by using waveband filters tuned to allow passage of light at the fluorescence wavelength and rejection of other wavelengths, especially the excitation wavelength.

CONCLUSION

One should understand that numerous variations may be made by one skilled in the art based on the teachings herein. The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for adjusting a target direction during pulsed laser vacuum deposition of a thin film, said method comprising:
   providing a vacuum chamber for housing a substrate for receiving said deposition of said thin film;
   providing a first target holder within said vacuum chamber for holding a target, said first target holder having a tilt control;

filling said first target holder with target material in a liquid state, said liquid target material comprising a solvent and a polymer; said vacuum chamber containing ambient air;

closing said vacuum chamber and purging said ambient air after said filling said first target holder with said target material in said liquid state;

cooling said target material after said purging said ambient air, said cooling sufficient to freeze said target material to a solid state to produce a solid target;

directing at least one laser at said solid target;

directing a camera system to view a plume produced from said solid target by said laser;

directing an illumination source to illuminate said plume produced from said solid target;

a processor receiving image data from said camera system;

said processor determining an axis of said plume based on said image data;

said processor comparing said axis of said plume to a predetermined axis to determine axis error information;

said processor sending an axis error correction control to said tilt control based on said axis error information, to correct said axis of said plume.

2. The method for adjusting target direction as recited in claim 1, wherein said polymer has a fluorescent response to said illumination source, and said camera system is responsive to the fluorescent response.

3. The method for adjusting target direction as recited in claim 2, wherein said target material further includes an additional material, said additional material having a fluorescent response to said illumination source.

4. The method for adjusting target direction as recited in claim 2, wherein said illumination source provides ultraviolet light.

5. The method for adjusting target direction as recited in claim 4, wherein said illumination source comprises a laser.

6. The method for adjusting target direction as recited in claim 1, wherein said step of purging the chamber comprises evacuating the chamber to at least a partial vacuum.

7. The method for adjusting target direction as recited in claim 1, wherein said step of purging the chamber comprises replacing the ambient air with a dry gas.

8. The method for adjusting target direction as recited in claim 1, wherein said solid target is tilted into a diagonal or vertical orientation after said freezing to said solid state.

* * * * *